(12) United States Patent
Stammer et al.

(10) Patent No.: US 12,720,706 B2
(45) Date of Patent: Aug. 25, 2026

(54) LIQUID MANIFOLD ASSEMBLY FOR ELECTRONICS CABINET

(71) Applicant: Hoffman Enclosures Inc., Anoka, MN (US)

(72) Inventors: Scott Stammer, Champlin, MN (US); Allen DeMars, Elk River, MN (US)

(73) Assignee: Hoffman Enclosures Inc., Anoka, MN (US)

( * ) Notice: Subject to any disclaimer, the term of this patent is extended or adjusted under 35 U.S.C. 154(b) by 266 days.

(21) Appl. No.: 18/485,983

(22) Filed: Oct. 12, 2023

(65) Prior Publication Data

US 2024/0130079 A1 Apr. 18, 2024

Related U.S. Application Data

(60) Provisional application No. 63/513,004, filed on Jul. 11, 2023, provisional application No. 63/415,536, filed on Oct. 12, 2022.

(51) Int. Cl.
*H05K 7/20* (2006.01)

(52) U.S. Cl.
CPC ..... *H05K 7/20272* (2013.01); *H05K 7/20781* (2013.01); *F28F 2225/08* (2013.01); *H05K 7/20327* (2013.01)

(58) Field of Classification Search
CPC ........... H05K 7/20272; H05K 7/20327; H05K 7/20781; F28F 2225/08
USPC .......................................................... 165/177
See application file for complete search history.

(56) References Cited

U.S. PATENT DOCUMENTS 2,692,961 A * 10/1954 Fondiller ............... H01H 63/00 165/47
7,635,020 B2 * 12/2009 Hartel .................... H02B 1/565 165/157
8,035,972 B2 10/2011 Ostwald et al.
8,654,532 B2 2/2014 Chen et al.
9,292,057 B2 3/2016 Cox et al.
9,668,383 B2 5/2017 Cox et al.
10,178,801 B2 1/2019 Liu et al.
10,827,648 B2 11/2020 Liu et al.
11,369,041 B2 6/2022 Yang et al.
11,700,713 B2 7/2023 Miyamura et al.
12,063,755 B2 * 8/2024 Yang ....................... F16L 41/08
2005/0193930 A1 9/2005 Hartel et al.
2006/0162946 A1 7/2006 Hartel et al.
(Continued)

FOREIGN PATENT DOCUMENTS

WO 2021/170103 A1 2/2021

*Primary Examiner* — Joel M Attey
(74) *Attorney, Agent, or Firm* — Quarles & Brady LLP

(57) ABSTRACT

A manifold assembly is provided for a server rack. The manifold assembly can include a manifold tube including at least one side wall. A channel can have a top portion and a bottom portion, each including at least one attachment aperture. A first stiffener can include at least one aperture and a second stiffener can include at least one aperture. The channel can be rigidly secured to the manifold tube to provide structural support thereto relative to the server rack. The first stiffener can be at least partially received within the channel at the top portion, and the at least one attachment aperture of the top portion can be aligned with the at least one aperture of the first stiffener.

18 Claims, 10 Drawing Sheets

(56) References Cited

U.S. PATENT DOCUMENTS

| | | | | |
|---|---|---|---|---|
| 2009/0223053 | A1* | 9/2009 | Gandy | B23K 9/0286 29/890.031 |
| 2010/0000721 | A1* | 1/2010 | Lai | H05K 7/20572 165/104.34 |
| 2015/0077930 | A1* | 3/2015 | Kadotani | H05K 7/20781 361/679.53 |
| 2016/0113153 | A1 | 4/2016 | Liu et al. | |
| 2016/0270260 | A1 | 9/2016 | Franz | |
| 2019/0182989 | A1 | 6/2019 | Chen et al. | |
| 2019/0208667 | A1 | 7/2019 | Liu et al. | |
| 2022/0015270 | A1* | 1/2022 | Miyamura | F16M 13/02 |
| 2022/0046823 | A1 | 2/2022 | Yang et al. | |
| 2022/0192054 | A1 | 6/2022 | DeMars | |
| 2022/0338384 | A1 | 10/2022 | Hogan et al. | |
| 2022/0400571 | A1 | 12/2022 | Yang et al. | |
| 2023/0018736 | A1 | 1/2023 | Tsai et al. | |
| 2023/0052671 | A1 | 2/2023 | Stammer et al. | |
| 2023/0180443 | A1* | 6/2023 | Costello | H05K 7/1492 361/699 |
| 2023/0301034 | A1 | 9/2023 | Miyamura et al. | |

* cited by examiner 300
362
313
315
307
304
306
330
332
B
305
317
312
350a
308
350b 300
362
313
307
315
304
302
306
332
336
B
305
317
312
350a
308
350b

LIQUID MANIFOLD ASSEMBLY FOR ELECTRONICS CABINET

CROSS-REFERENCE TO RELATED APPLICATIONS

This application claims priority to U.S. Provisional Patent Application No. 63/415,536 filed Oct. 12, 2022 and U.S. Provisional Patent Application No. 63/513,004 filed Jul. 11, 2023, the entirety of which are incorporated by reference.

BACKGROUND

In some cooling system applications, a manifold may deliver flows of cooling fluid to and from electronics supported on a rack within a cabinet or stack. For example, some liquid cooling systems can include manifolds that allow pumped fluid to individually cool multiple server trays that are stacked vertically within a server rack or other arrangement. In such systems, avoiding leakage of cooling fluid in the vicinity of the electronics that are to be cooled may be important.

SUMMARY

Some embodiments of the invention can provide a manifold assembly for a server rack. The manifold assembly can include a manifold tube including at least one side wall. A channel can have a top portion and a bottom portion. Each of the top portion and the bottom portion can include at least one attachment aperture. A first stiffener can include at least one aperture and a second stiffener can include at least one aperture. The channel can be rigidly secured to the manifold tube to provide structural support thereto relative to the server rack. The first stiffener can be at least partially received within the channel at the top portion, and the at least one attachment aperture of the top portion can be aligned with the at least one aperture of the first stiffener. The second stiffener can be at least partially received within the channel at the bottom portion, and the at least one attachment aperture of the bottom portion can be aligned with the at least one aperture of the second stiffener.

Some embodiments of the invention can provide a manifold assembly for a server rack. The manifold assembly can include a manifold tube extending along an elongate portion of the manifold assembly, a channel including a first distal portion with a first aperture, and a first stiffener. The first stiffener can include a first longitudinal portion and a second longitudinal portion, the first longitudinal portion including a second aperture and the second longitudinal portion including a third aperture. The first longitudinal portion can be received in the distal portion of the channel. The second longitudinal portion can extend outwardly from the channel in an elongate direction of the manifold assembly, the second aperture being axially aligned with the first aperture. The third aperture can be configured to align with a corresponding retention feature of a server rack.

Some embodiments of the invention can provide a manifold assembly for a server rack, wherein the manifold assembly can include a first distal portion, a second distal portion, and an elongate portion between the first distal portion and the second distal portion, a manifold tube, a channel, and a locating stud. The manifold tube can define a counterbore. The channel can have a first attachment aperture at the first distal portion, and further including a locating aperture defining a first width, and the channel can define a first thickness along the elongate portion. The locating stud can include a first portion sized and configured to matingly engage the counterbore. The channel can be rigidly secured to the manifold tube to provide structural support thereto relative to the server rack. The locating stud can be secured within the counterbore and at least partially extend through the locating aperture. The channel assembly can define a second thickness at the first distal portion, and the second thickness can be greater than the first thickness.

Some embodiments can provide a method of assembling a manifold assembly for a server rack. A channel can be rigidly secured to a manifold tube to provide structural support for the manifold tube, with a distal end of the channel having an attachment aperture. A first stiffener can be aligned to be at least partially received within the channel at the distal end, so that the channel and the first stiffener collectively define a first thickness that is greater than a thickness of the channel and the attachment aperture is aligned with an aperture of the first stiffener to define a first attachment point to secure the manifold to the server rack.

Some embodiments of the invention can provide a method of assembling a manifold assembly for a server rack. The method can include rigidly securing a channel to a manifold tube to provide structural support for the manifold tube, with a distal end of the channel having an attachment aperture and aligning a first stiffener to be at least partially received within the channel at the distal end. The channel and the first stiffener can collectively define a first thickness that is greater than a thickness of the channel and the attachment aperture can be aligned with an aperture of the first stiffener to define a first attachment point to secure the manifold assembly to the server rack.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
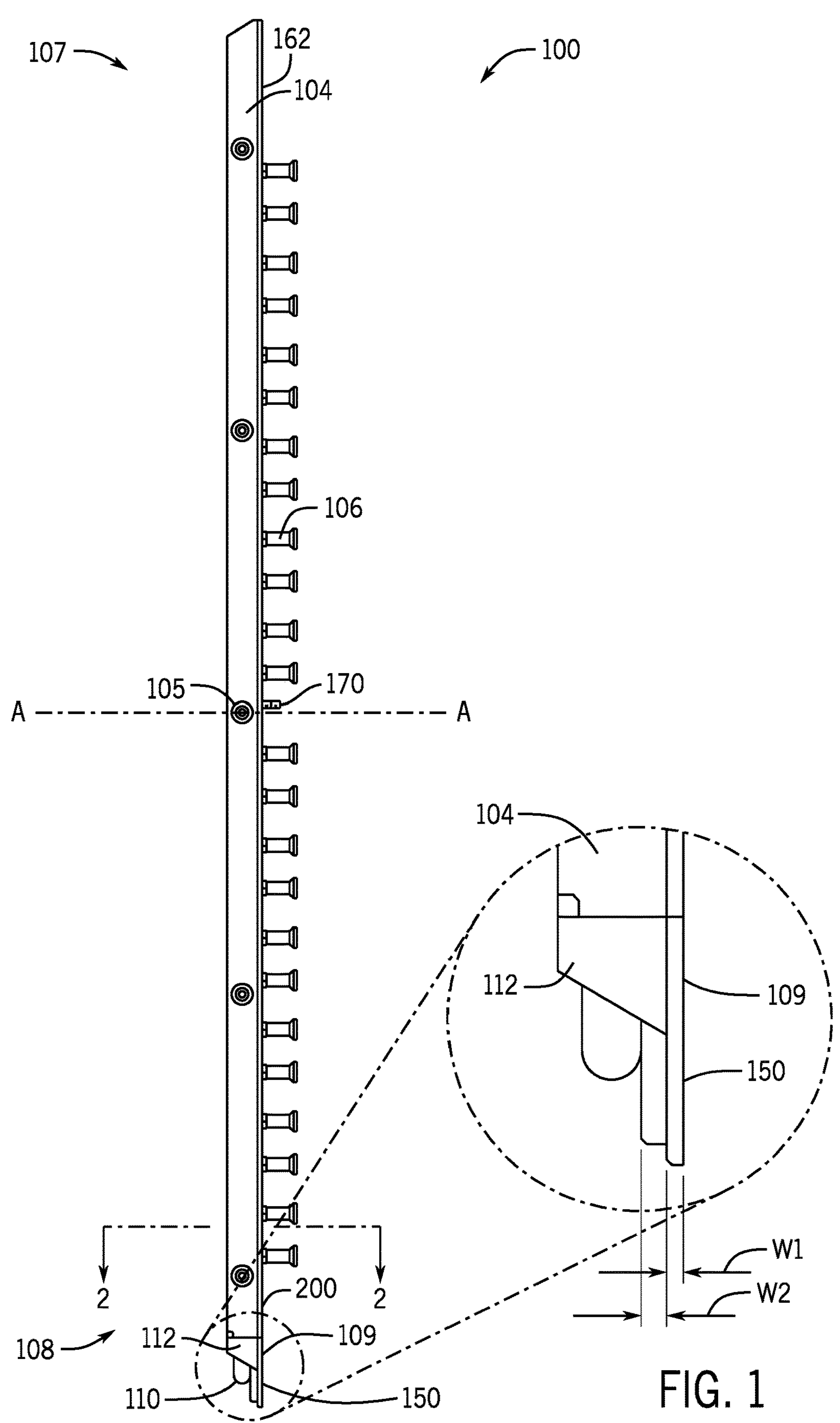
FIG. 1 is a left elevation view of a manifold assembly according to an embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Similarly, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "only one of," or "exactly one of" For example, a list of "only one of A, B, or C" indicates options of: A, but not B and C; B, but not A and C; and C, but not A and B. In contrast, a list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more A, one or more B, and one or more C. Similarly, a list preceded by "a plurality of" (and variations thereon) and including "or" to separate listed elements indicates options of one or more of each of multiple of the listed elements. For example, the phrases "a plurality of A, B, or C" and "two or more of A, B, or C" indicate options of: one or more A and one or more B; one or more B and one or more C; one or more A and one or more C; and one or more A, one or more B, and one or more C.

Also as used herein, unless otherwise limited or defined, the terms "about" and "approximately" refer to a range of values ±5% of the numeric value that the term precedes. As a default the terms "about" and "approximately" are inclusive to the endpoints of the relevant range, but disclosure of ranges exclusive to the endpoints is also intended.

Also as used herein, unless otherwise limited or defined, "integral" and derivatives thereof (e.g., "integrally") describe elements that are manufacture as a single piece without fasteners, adhesive, or the like to secure separate components together. For example, an element stamped as a single-piece component from a single piece of sheet metal, without rivets, screws, or adhesive to hold separately formed pieces together is an integral (and integrally formed) element. In contrast, an element formed from multiple pieces that are separately formed initially then later connected together, is not an integral (or integrally formed) element.

Also as used herein, unless otherwise defined or limited, the term "lateral" refers to a direction that does not extend in parallel with a reference direction. A feature that extends in a lateral direction relative to a reference direction thus extends in a direction, at least a component of which is not parallel to the reference direction. In some cases, a lateral direction can be a radial or other perpendicular direction relative to a reference direction.

Also as used herein, unless otherwise defined or limited, the term "substantially identical" indicates components or features that are manufactured to the same specifications (e.g., as may specify materials, nominal dimensions, permitted tolerances, etc.), using the same manufacturing techniques. For example, multiple parts stamped from the same material, to the same tolerances, using the same mold may be considered to be substantially identical, even though the precise dimensions of each of the parts may vary from the others.

As used herein, unless otherwise limited or defined, "substantially perpendicular" indicates a direction that is within ±12 degrees of perpendicular a reference direction (e.g., within ±6 degrees or ±3 degrees), inclusive.

Also as used herein, unless otherwise limited, a "fluid port" means any feature that provides a transition into or out of a particular system along a fluid particular flow path. Thus, for example, a fluid port can include simple openings in structures that are configured for fluid flow, or more complex mechanisms such as fluid couplings (e.g., a quick-connect coupling). A fluid port can include one or more features or one or more components (e.g. may be an assembly of multiple parts) that can provide the transition in or out of a particular system. For example, a fluid port can include a fitting (e.g., a quick-connect coupling) and corresponding features (e.g., an inlet aperture) on a system (e.g., a pipe or manifold) in communication with the fitting.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Some of the discussion below describes interfaces between structures of a liquid manifold and an enclosure (e.g., a server rack) that can be used to help provide liquid cooling to server racks. The context and particulars of this discussion are presented as examples only. For example, embodiments of the disclosed invention can be used in other contexts, such as for cooling computing equipment other than servers, or various other electronics, configured in various ways, including with other shapes and arrangements of elements.

When electronic equipment is cooled using liquid coolant, it can be useful to provide blind mate connections and quick connect (e.g., quick disconnect) fittings at interfaces between electrical equipment and other components along a cooling loop (e.g., a liquid manifold). For example, a server or other electronics assembly can be configured to be readily (e.g., partly automatically) aligned for connection to a flow system for liquid cooling of the server or other electronics as the assembly is moved into position for operation. This may allow operators to ensure secure attachment of fluid couplings (e.g., fluid ports of the manifold and the servers) without manual engagement of the couplings or particular attention to alignment of the various components during installation. For example, some systems can provide automatic or partly automatic vertical and lateral alignment between fluid ports of a liquid manifold and ports of servers or other electronic equipment.

In some cases, deformation and tolerance stack-up of a manifold tube can result in misalignment between fluid ports of the manifold and corresponding fluid ports of electrical equipment to be fluidly connected to the liquid manifold. Misalignment of fluid ports, and system deformation (e.g., a change in orientation or position of fluid ports of a liquid manifold relative to fluid ports of electrical equipment), can result in fluid leakage, which can damage electrical equipment and other equipment in a data center.

In some cases, deformation can be introduced in a manifold tube through manufacturing processes that generate significant heat (e.g., friction, drilling, etc.). In some cases, forces on a liquid manifold tube can produce deformation over time (e.g., variation in heat load of the manifold tube, forces introduced on the tube as a result of mounting of the tube to a rack, a weight of the tube, a pressure at fluid ports of a manifold, etc.). It can therefore be advantageous to provide systems and methods for reducing heat in manufacturing and assembly of a manifold assembly (e.g., including a manifold tube) and reduce deformation forces along a manifold tube during operation.

In this regard, some conventional approaches for construction of server racks and cooling manifolds may result in substantial variations in relevant dimensions, which can have substantial detrimental effects on alignment between associated components. For example, many conventional systems use manifolds and electronics racks that are manufactured from formed (e.g., bent and stamped or laser cut) sheet metal. Correspondingly, these systems can be susceptible to deformation produced by forces on the manifold (e.g., a force produced by attachment points between the manifold and a server rack, deformation from liquid pressure at ports along the manifold, etc.).

In some conventional systems, thick-walled manifold tubes (e.g., tubes with a wall thickness of 0.25 in or greater) are used to provide structural rigidity for a manifold. However, manufacturing ports in a thick-walled tube can include methods that create distortion or shrinkage of the manifold tube. For example, some approaches can include welding a threaded port to the manifold, by tapping the thick wall manifold tube, or tapping a port formed in the manifold through friction drilling. Thus, these and other systems can exhibit substantial dimensional variances and can create stacked tolerance issues as a consequence of the manufacturing techniques and mounting configurations associated with the systems, as well as other factors inherent in the configuration and installation of conventional liquid manifolds and liquid manifold assemblies. Accordingly, for example, it may be difficult in conventional systems to ensure appropriate alignment of blind-mate connectors and, correspondingly, fluid connection, between opposing sides of fluid couplings. As noted above, this may be problematic due to the effects of exposing electronics to certain liquids (e.g., water).

Further, thick-walled manifold tubes can increase a weight of a manifold, which can increase a difficulty of installing the manifold in a rack. In this regard, for example, failure to appropriately secure couplings for fluid transfer can result in poor performance of the relevant electronics, including decreased rates of heat transfer due to a lack of adequate flow of cooling fluid resulting from loss of fluid from the liquid cooling system.

Considerations beyond dimensional variation can also complicate the task of making secure and predictable connections at fluid couplings for liquid cooling. For example, pressure of fluid flow at fluid couplings can tend to urge the couplings to separate, with corresponding forces on associated manifolds and electronics racks. Additionally, many quick-connect couplings utilize spring-loaded components. The forces of the springs can also impose substantial forces on manifolds and electronics racks, particularly for non-locking connections in which spring forces may not be absorbed by locking devices during system operation. In this regard, for example, some manifolds may be subject to lateral loading of 800 pounds or more during operation. Such loading can also create (or exacerbate) problems with misalignment of components, including for manifolds that may be secured to larger support structures at a small number of attachment points (e.g., less than four attachment points). Still further, manifolds may be prone to deformation at attachment points of the manifold to a rack. Attachment points of the manifold to the rack can produce a moment on the manifold, and in conjunction with other forces on the manifold (including as described above) can produce deformation along the manifold, which can further exacerbate dimensional variations and misalignment of ports with corresponding ports of electrical equipment.

There is therefore a need in the field of liquid cooling for improved manifold assemblies providing sufficient structure to withstand deformation forces while also reducing friction and heat inputs for manufacturing and assembly and reducing a weight of the manifold assembly.

Embodiments of manifold assemblies according to this disclosure can address these and other issues by helping to ensure appropriately aligned engagement between fluid ports on cooling manifolds and on electronics assemblies (e.g., to facilitate blind-mate connections between ports of a manifold assembly and electrical equipment in a rack). A manifold assembly can include a structural element (e.g., a channel) configured to ensure sufficient rigidity of the manifold assembly (e.g., a resistance to lateral deformation) for support of a tube for delivering or receiving a fluid. In some cases, the structural element can be a sheet-metal channel. The structural element can be directly mounted to a rack, and the manifold tube can be secured to the structural element. In this configuration, the structural element can reduce a deformation force on the manifold tube by at least partially isolating the tube from deformation forces at mounting locations (e.g., with attachment points located along the structural element rather than the manifold tube). The manifold tube can be secured to the channel (e.g., by welding or using fasters) at different locations along an elongate direction of the manifold tube, and deflection of the manifold tube due to reaction forces within the fluid distribution system can thereby be reduced.

In some examples, stiffeners can be provided along the channel at a top and bottom of the channel (e.g., at or near attachment points of the manifold to the rack) and can provide additional structure to the manifold assembly and help to reduce a deflection of the channel at the attachment points. The stiffeners can be installed within the channel mechanically rather than with welds, which can reduce a heat generated during manufacturing or installation, and consequently, reduce further deflection or deformation of the manifold assembly.

Reducing the forces imparted on the manifold tube, including through the use of mechanical stiffeners as disclosed herein, can allow for the use of lighter gauge manifold tube materials (e.g., can facilitate the use of thin or moderately thick-walled tubing). This can correspondingly reduce the cost of manufacturing, and increase an ease of installation of the manifold assembly by reducing a weight of the manifold assembly. Additionally, use of a lighter gauge manifold can reduce friction and heat generated in machining ports in the manifold tube, which can further reduce a potential deflection of the tube and the manifold assembly or other adverse dimensional effects. As a particular example, when a thickness of the manifold tube is reduced, it can be easier to machine ports and other features of a manifold tube using precision machining techniques (e.g., computer numerical control ("CNC") machining), which can additionally reduce handling during manufacturing.

In some embodiments, components of a manifold assembly can be configured to be located quickly and accurately within the assembly. For example, in some embodiments, a moderately thick-walled tube (e.g., a tube having a wall thickness of less than 0.25 in) can be secured within a channel (e.g., an elongate sheet-metal channel structure), and features of the manifold tube and the channel can be matingly engaged to at least partially define a spatial relationship between the manifold tube and the channel. In some cases, a manifold tube can have protruding elements that correspond to apertures or recessed portions of a channel, to restrict movement of the manifold tube relative to the channel in one or more directions. In some examples, the channel can be secured to the manifold tube at predetermined locations (e.g., at apertures or other features of the channel) to prevent warping and deformation of the manifold assembly.

In some cases, a structural support (e.g., a channel) can be configured to substantially envelop a manifold tube (i.e., can extend around a majority of a perimeter of the manifold tube). For example, some arrangements can wrap around at least three out of four sides of a square manifold tube. A structural support can also be secured to a manifold tube at locations adjacent fluid ports (e.g., on opposite walls of the tube), including by welding or mechanical fasteners. In some embodiments, the locations of the securements between the channel and the manifold tube are in alignment with the respective neighboring fluid ports. In other words, for example, the centers of the securement locations and the centers of the respective neighboring fluid ports can lie along a single plane extending through the manifold tube perpendicular to the length dimension thereof or can lie substantially along such a plane (i.e., be at a location that is within a vertical range defined by upper and lower edges of the relevant fluid port). In some embodiments, the centers of the securement locations can be located near the respective fluid port, within 15 percent or less of the distance between the center of the respective fluid port and the nearest adjacent fluid port. This can reduce deformation of the manifold tube and can add targeted areas of strength within a manifold assembly where internal and external forces may most likely be experienced.

In this regard, FIG. 1 illustrates an example manifold assembly 100 for delivery of cooling flow to electronics (not shown) supported within the server rack (not shown). In the illustrated example, the manifold assembly 100 has a manifold tube 102 (see FIG. 2-4), a channel 104, and a plurality of liquid ports 106 (e.g., quick-connect couplings). The manifold assembly 100 can be coupled to a server rack to provide a path for coolant flow, to transfer heat away from electronics of the server rack.

A manifold assembly can be secured in a vertical orientation within a server rack and can provide liquid coolant flow to servers housed at different heights within the server rack when connected to a fluid coolant loop. FIG. 1 illustrates the manifold assembly 100 in a vertical orientation with a top portion 107 at a first distal end of the manifold assembly 100 and a bottom portion 108 at a second distal end of the manifold assembly 100. When installed within a rack, the top portion 107 is secured near the top of the rack at one or more top attachment points 162 (e.g., attachment points 162 illustrated in FIG. 4) and the bottom portion 108 is secured to the rack at a bottom attachment point 150 (e.g., attachment points 150 illustrated in FIG. 3). An attachment point can include a location along a manifold assembly at which the manifold assembly is configured to be secured to an enclosure frame, and can include features and geometries to facilitate an attachment of the manifold assembly to a rack (e.g., to a frame of a rack). For example, as discussed further below, an attachment point can include apertures through which a fastener can extend to secure the manifold assembly to the rack (e.g., apertures at attachment points 150 shown in FIG. 3 and apertures 162 shown in FIG. 4). In some embodiments, a manifold assembly can include one or more attachment points between a top attachment point and a bottom attachment point, to provide additional support for the manifold assembly and further reduce deflection of the manifold assembly or components thereof.

In some embodiments, including as shown, the manifold assembly 100 can be configured to receive fluid in a bottom-feed configuration. As shown, therefore, hosing 110 is shown entering the manifold assembly 100 at the bottom portion 108. In other embodiments, hosing can enter the manifold assembly at a top portion (e.g., fluid can enter the manifold assembly through an entry port in the top portion 107 for top-feed configurations). In the illustrated example, the manifold assembly is asymmetrical about a central axis A with the bottom portion 108 being differently configured than the top portion 107. As an example, a mounting lip 109 can extend downwardly from the channel 104 at the bottom portion 108 along a front face of the channel 104 of the manifold assembly 100. A difference in configuration of the top portion 107 and the bottom portion 107 can aid an operator in identifying a correct installation configuration. In other examples, a manifold assembly can be symmetrical about a central axis A.

The illustrated manifold assembly 100 includes twenty-four ports 106, but in other configurations, a manifold assembly can have more ports or fewer ports. In some cases, a number of ports can correspond to a length of a manifold (e.g., ports can be spaced along the manifold at uniform distances). In some cases, a number of ports can correspond to a number of servers in a rack in which the manifold assembly is installed. For example, a server rack can include a predefined number of vertical shelves (e.g., slots) for housing electrical equipment having standard heights (e.g., 1 rack unit (U) or about 44 mm). A spacing of ports along a liquid manifold can correspond to a vertical spacing between shelves in the rack (e.g., ports of a manifold can be spaced apart from adjacent ports by about 1U or about 2U). This arrangement can allow ports 106 of the liquid manifold assembly 100 to be at a fixed position relative to corresponding shelves of a server rack when the manifold assembly is mounted to the server rack. When electrical equipment (e.g., a server, a switch, a storage device, etc.) is mounted to the rack within a shelf (e.g., in an installed position), a fluid port of the electrical equipment can be positioned on the electrical equipment to matingly engage a fluid port of the manifold assembly corresponding to the shelf.

In some configurations, fluid ports of a manifold can be dimensioned (e.g., spaced vertically) to accommodate particular rack configurations (e.g., non-standard or bespoke installations, installation heights defined by industry standards, national or international regulations, etc.). For example, in some embodiments, a manifold assembly can include 42 ports (e.g., one port for each 1U slot in a rack having 42U). In some cases, shelves of a rack can be configured to receive components having a height of 2U, and a manifold assembly can have 21 ports to correspond to each 2U slot within a rack. In some cases, a rack can include a mix of electronic components having different heights (e.g., a storage rack having 1U storage nodes and 2U or 4U disk shelves) and manifold assemblies can include a number of ports corresponding to a total number of electronic components in shelves of the rack, the ports being spaced to correspond to a spacing of the electronic components in the rack.

Additionally (or alternatively), fluid ports of a manifold assembly can be configured to be received into corresponding fluid ports of electrical equipment (e.g., fluid ports of a manifold assembly can have a male configuration) or can receive corresponding fluid ports of electrical equipment (e.g., fluid ports of the manifold assembly can have a female configuration). Further, a diameter of the fluid ports (e.g., a diameter of the quick connect fittings comprising the fluid ports) can be adapted for particular applications to achieve desired flow rates and pressure characteristics of cooling systems in which the liquid manifold is installed.

In some cases, a manifold or manifold assembly can be generally susceptible to deflection or deformation at attachment points of the manifold to a server rack. For example, during installation or operation, an attachment point can produce a moment on the manifold assembly that, in conjunction with other forces (e.g., a weight of the manifold assembly, fluid pressures, etc.) can produce deflection at or near the attachment point. The attachment points can be the point at which a force is provided opposite a liquid pressure from liquid flowing through the ports of the manifold assembly. In some conventional manifolds or manifold assemblies, thick-walled manifold tubes are utilized to prevent deformation. However, this can increase a weight of the manifold assembly, which can increase a difficulty of installation of the manifold. Further, thick-walled manifolds can be susceptible to deformation in a manufacturing or machining of the manifold. For example, a thickness of the wall can make some precision manufacturing techniques (e.g., CNC) impractical, and can require friction-producing methods to cut or drill portions of the thick-walled manifold. Deformations can be produced in a manifold due to heat and friction produced in machining ports, as described above. Some embodiments disclosed herein can address this issue by providing structural elements to increase a rigidity of a manifold assembly, thus allowing for relatively thinner-walled manifold tubes (e.g., manifold tubes having wall thicknesses of less than 0.25 in).

In this regard, for example, FIG. 1 further illustrates a stiffener 112 installed at the bottom portion 108 of the manifold assembly 100. The stiffener 112 can be a structural component to reinforce the channel 104 along one or more sides of the channel 104. As further described and illustrated with respect to FIGS. 2-4, the stiffener 112 can add increased structure to the manifold assembly (e.g., including at attachment points of the manifold assembly) and can thereby reduce a risk of deformation along the manifold assembly by increasing an effective thickness of the channel 104 at points along the channel 104 (e.g., attachment points) For example, as shown in FIG. 1, the mounting lip 109 of the channel 104 can define a first thickness W1 and the stiffener 112 can define a second thickness W2. At the attachment point 150 (e.g., the apertures at attachment points 150 at which the manifold assembly is secured to the rack), a thickness of the manifold assembly 100 can be the sum of the thickness W1 of the channel 104 (e.g., the thickness of the mounting lip 109) and the thickness W2 of the stiffener 112. In some cases, a stiffener can be produced by subtractive manufacturing techniques. In some examples, a geometry of a stiffener (e.g., stiffeners 312, 313 illustrated in FIGS. 8-11) can allow for casting of the stiffener. In some cases, a property of the stiffener can advantageously enhance a rigidity of a manifold assembly. For example, a stiffener can define a thickness to accommodate forces at an attachment point (e.g., as described below). A material of a stiffener can be different from a material of a channel or manifold tube of a manifold assembly. For example, in some cases, a channel can be formed from stainless steel, and a stiffener can be formed from a stainless-steel alloy, or other materials selected to withstand forces at an attachment point of the manifold assembly to a rack.

Generally, the stiffener 112 can be installed in the channel 104 mechanically, without the need for heat or welding (e.g., using pins, screws, or other fasteners or matingly engaging features of a channel and a stiffener). In some cases, this can further reduce a deformation or deflection of the assembly relative to an intended profile, due to the corresponding reduction in thermally-induced stresses along the channel 104.

Further, the stiffener 112 can reduce a weight of the manifold assembly 100 by providing reinforcement at key points along the channel 104 rather than along the whole length of the channel 104. For example, in the embodiment shown, the stiffener 112 may extend into the channel 104 only so far as to engage an end of the manifold tube 102. The shorter-length stiffener 112 can allow for additional reduction in weight by reducing loading on the manifold tube 102 itself, so that a thinner walled (e.g., a moderately thick-walled) tube can be used for the manifold assembly 100. For example, a thickness of a wall of the manifold tube 102 may not need to be selected to withstand the deflection forces at attachment points of the manifold assembly 100 to the server rack, because the stiffener 112—and not necessarily the manifold tube 102—can provide the necessary structure for the attachment point(s).

A manifold assembly can include features to retain a manifold tube within a channel and define an interface between the manifold tube and the channel. A channel can define attachment points of a manifold assembly to a cabinet or other assembly, and thus, it can be advantageous for a manifold assembly to include features and systems to at least partially prevent a deformation of a tube (e.g., due to heat loads or fluid pressures) from producing a corresponding deformation on the channel. For example, it can be advantageous to define a clearance between a manifold tube and a channel to allow for deformation and dimensional tolerances of the tube without producing a corresponding deformation of the channel. In some cases, a clearance between a manifold tube and a channel can allow for some deformation on the channel without producing a corresponding deformation on the tube.

In some cases, a tube can experience pressure forces in a direction parallel to fluid flow (e.g., a fluid flowing into or out of the fluid ports 106 can exert a force or pressure on the tube). It can thus be advantageous to space the channel 104 from the tube (not shown) in a direction parallel to the fluid flow direction to limit deformation forces on the channel 104. As will be described below, with respect to FIGS. 5 and 6, mechanical features can be provided along the manifold assembly 100 to space the channel 104 from the tube, and provide a reference geometry (e.g., a datum plane) between the channel 104 and the tube 102 to at least partially define attachment points between the tube 102 and the channel 104 (e.g., a location of the weld aperture 105 of the channel 104 relative to the tube).

In some cases, the manifold assembly 100 can include a stud 170 defining a threaded rod extending from the manifold assembly 100. The threaded rod of the stud 170 can define an attachment interface for securing the manifold 100 to an enclosure, or for securing a component to the manifold assembly 100. Further, as discussed with respect to FIGS. 5 and 6, geometries of the stud 170 can provide a reference geometry defining a distance between the channel 104 and the tube 102. For example, features of a channel and tube of a manifold assembly can be sized and otherwise configured to engage (e.g., to matingly engage) each other when the tube and the channel are positioned in a desired installation position relative to each other. In some cases, protrusions on one of the channel or the tube can be received into corresponding apertures or recessed features in the other of the channel or the tube to indicate an appropriate alignment, and at least partially constrain a displacement of the tube relative to the channel in at least one direction.

A tube can be secured at multiple points within a channel, which can reduce a loading force on individual attachment interfaces (e.g., spot welds) between the channel and the tube. In other words, increasing a number of attachment interfaces between a tube and a channel can advantageously reduce a total load on each individual interface, and therefore reduce a potential for deformation at a given attachment interface between the tube and the channel. In this regard, a tube can be welded to a channel (e.g., using spot welds) at multiple weld interfaces speced along an elongate direction of the tube and the channel.

For example, as further illustrated in FIG. 1, the channel 104 can include weld apertures 105. The weld apertures 105 can be spaced along the channel 104 vertically at predetermined intervals. While FIG. 1 illustrates a left side of the manifold assembly 100, the right side of the manifold assembly 100 can be substantially identical to the left side and can include weld apertures that are aligned vertically (e.g., at the same vertical height) with the weld apertures 105 illustrated on the left side. The weld apertures, in conjunction with reference geometries defined between the channel 104 and the tube (e.g., a datum plane defined by stud 170) can determine weld locations along the tube at which the tube and the channel 104 can be attached.

Figure 2:
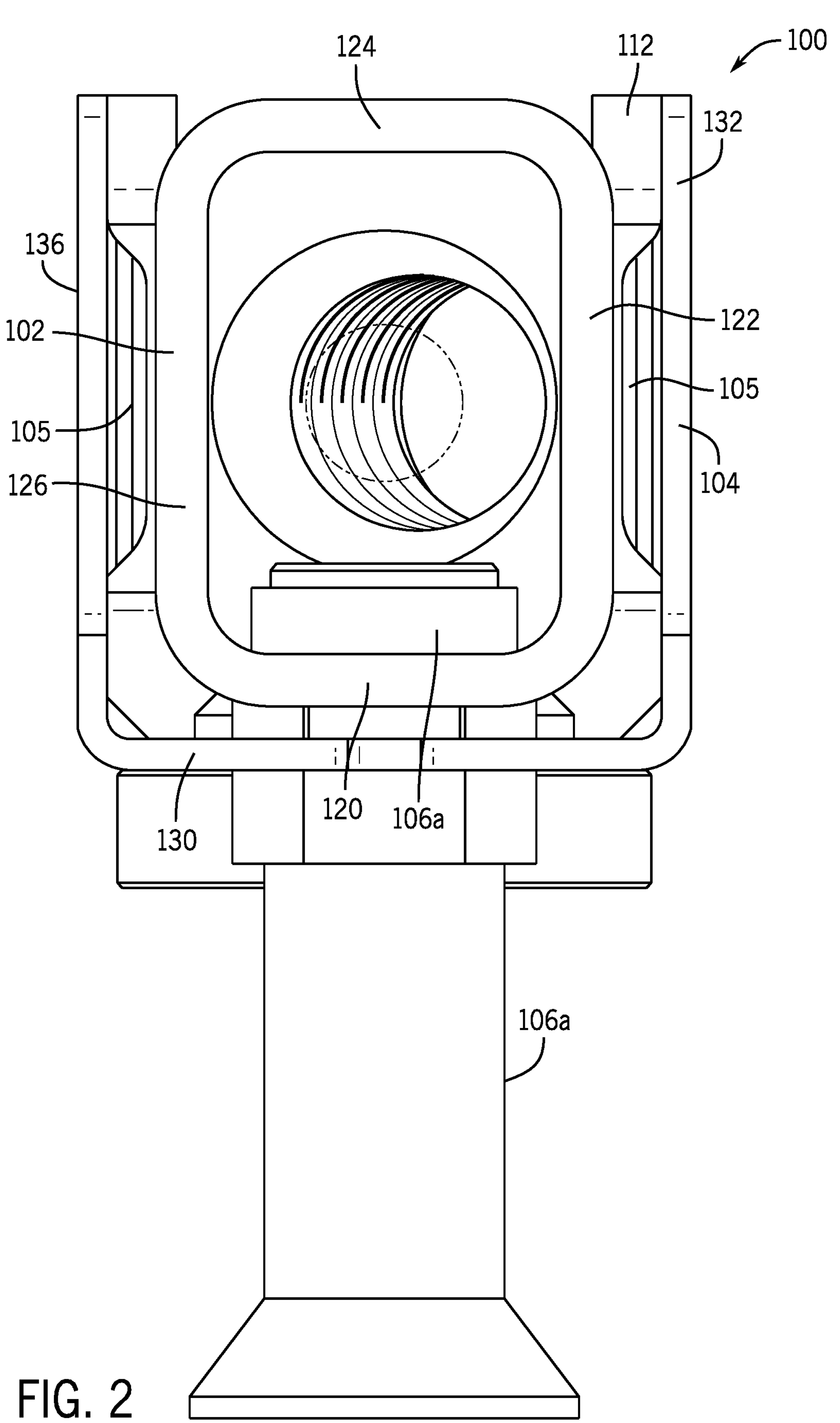
FIG. 2 is a cross-sectional view of the section of the manifold assembly of FIG. 1 along line II-II.

FIG. 2 illustrates a cross-sectional view of the manifold assembly, showing the manifold tube 102 received within the channel 104. As illustrated, the manifold tube 102 can be received into the channel 104, so that the channel can at least partially surround the manifold tube 102 (e.g., along three sides of the manifold tube 102, as shown). The manifold tube 102 can include a square tube, which, in some embodiments can define a square cross-sectional profile. For example, as shown in FIG. 2, the manifold tube 102 can have a first manifold wall 120, a second manifold wall 122, a third manifold wall 124, and a fourth manifold wall 126. The channel can be formed as a C-channel having a first channel wall 130, a second channel wall 132, and a third channel wall 136. The second and third channel walls 132, 134 can extend outwardly from the first channel wall 130, substantially perpendicularly to the first channel wall 130 at opposite sides of the first channel wall 130. In some examples, a channel can be formed from a sheet metal through a bending process, and corners between the first channel wall 130 and the channel walls 132, 134 can be rounded.

When the manifold tube 102 is installed in the channel 104, a surface of the first, second, and fourth manifold walls 120, 122, 126 can be parallel to a surface of the first, second, and third channel walls 130, 132, 136 respectively. In some examples, as also shown in FIG. 2, the manifold tube 102 can be spaced generally apart from the channel walls 130, 132, 136 (e.g., as supported by the stiffener 112). In the illustrated example, the fluid port **106*a* extends through the first manifold wall 120 and the first channel wall 130**. In some examples, a fluid port can extend at different orientations within a manifold assembly. For example, a fluid port can extend from a side of a manifold tube that does not correspond to a manifold wall (e.g., the fluid port can extend from the tube along an open side of a channel, so that the fluid port does not extend through the channel). In some examples, a manifold tube can define other cross-sectional profiles, including, for example, circular, semi-circular, rectangular, a polygonal profile having 5 sides, 6 sides, 7 sides, 8 sides, or more than 8 sides, triangular, oval, or any other cross-sectional shape.

In some embodiments, a manifold tube of a manifold assembly (e.g., manifold tube 102) can be constructed of steel. In some embodiments, a manifold tube can define a square cross-sectional profile with side lengths of about 1.5 inches. In some embodiments, the length of sides of the square cross-sectional profile can be about 1.25 inches, about 1.75 inches, about 2 inches, about 2.5 inches, or about 2.6 inches. In some embodiments, the manifold tube 102 can include moderately thick walls, so that a wall thickness of the tube is less than about 0.25 inches. In some embodiments, a wall thickness of the walls of the manifold tube can be about 0.188 in, about 0.12 in, about 0.109 in, about 0.095 in, about 0.083 in, about 0.072 in, about 0.065 in, about 0.049 in, or about 0.035 in. In some case, a wall thickness of the manifold tube can be between about 0.049 in and about 0.75 in. Unless otherwise specified or limited, the terms “about” and “approximately,” as used herein with respect to a reference value, refer to variations from the reference value of ±20% or less (e.g., ±15, ±10%, ±5%, etc.), inclusive of the endpoints of the range. In some cases, a width of a manifold tube can correspond to a side of liquid ports required for the manifold tube, and forces exerted at liquid ports (e.g., fluid pressure and spring forces). In some cases, a larger diameter of liquid ports can require relatively thicker walls for a manifold tube, to allow for retention of the liquid port relative to the tube. In some cases, a number of liquid ports along a manifold tube can correlate to a thickness of the manifold tube, For example, a manifold tubes with a greater number of liquid ports can require greater wall thickness (e.g., due to increased fluid pressure and spring pressure from quick-disconnect fittings) than manifolds tubes having a lesser number of liquid ports.

Generally, a manifold tube can be secured (e.g., welded) to a channel along sides that do not include fluid ports. For example, the second manifold wall 122 can be secured to the second channel wall 132 through plug welds at the weld apertures 105 defined in the second channel wall 132. Similarly, the fourth manifold wall 126 can be secured to the third channel wall 136 through plug welds at the weld apertures 105 defined in the third channel wall 136. In some embodiments, the manifold tube 102 and the channel 104 can also be similarly welded or mechanically fastened together at the distal ends of the manifold tube 102 and the channel 104 (e.g., at the bottom portion 108 and the top portion 107). This can reduce the amount of stress concentrated at the most distally located port hole locations. In the case of welding, the symmetrical locations of the weld apertures 105, and consequently the plug welds, can reduce the likelihood of deformation of the manifold assembly 100 because shrinkage resulting from the weld between the second manifold wall 122 and the second channel wall 132 can be countered by shrinkage resulting from the weld between the fourth manifold wall 126 and the third channel wall 136. Thus, providing a symmetrical welding pattern can help to maintain the tight tolerances needed to effectively connect and ensure predictable first-axis alignment between the coolant connector of a rack support (not shown) and the fluid ports 106 of the manifold assembly.

As further shown in FIG. 2, the stiffener 112 can be provided at a distal portion of the manifold assembly (e.g., the bottom portion 108). The stiffener 112 can engage portions of one or more (e.g., all) of the first, second, and third channel walls 130, 132, and 134, and can provide structural reinforcement along the manifold assembly 100. As illustrated, the stiffener 112 can effectively increase a thickness of material at a corresponding section of the channel 104, which can prevent or reduce deformation or deflection at the corresponding portions of the channel 104. In some cases, a stiffener for a channel of a manifold assembly does not contact a manifold tube, and forces on the stiffener are thus insulated from the manifold tube. In some cases, a stiffener can define geometries that engage with a manifold tube, and a stiffener can function as a locating feature for the tube, and a retaining feature to further retain the tube relative to the channel.

Figure 3:
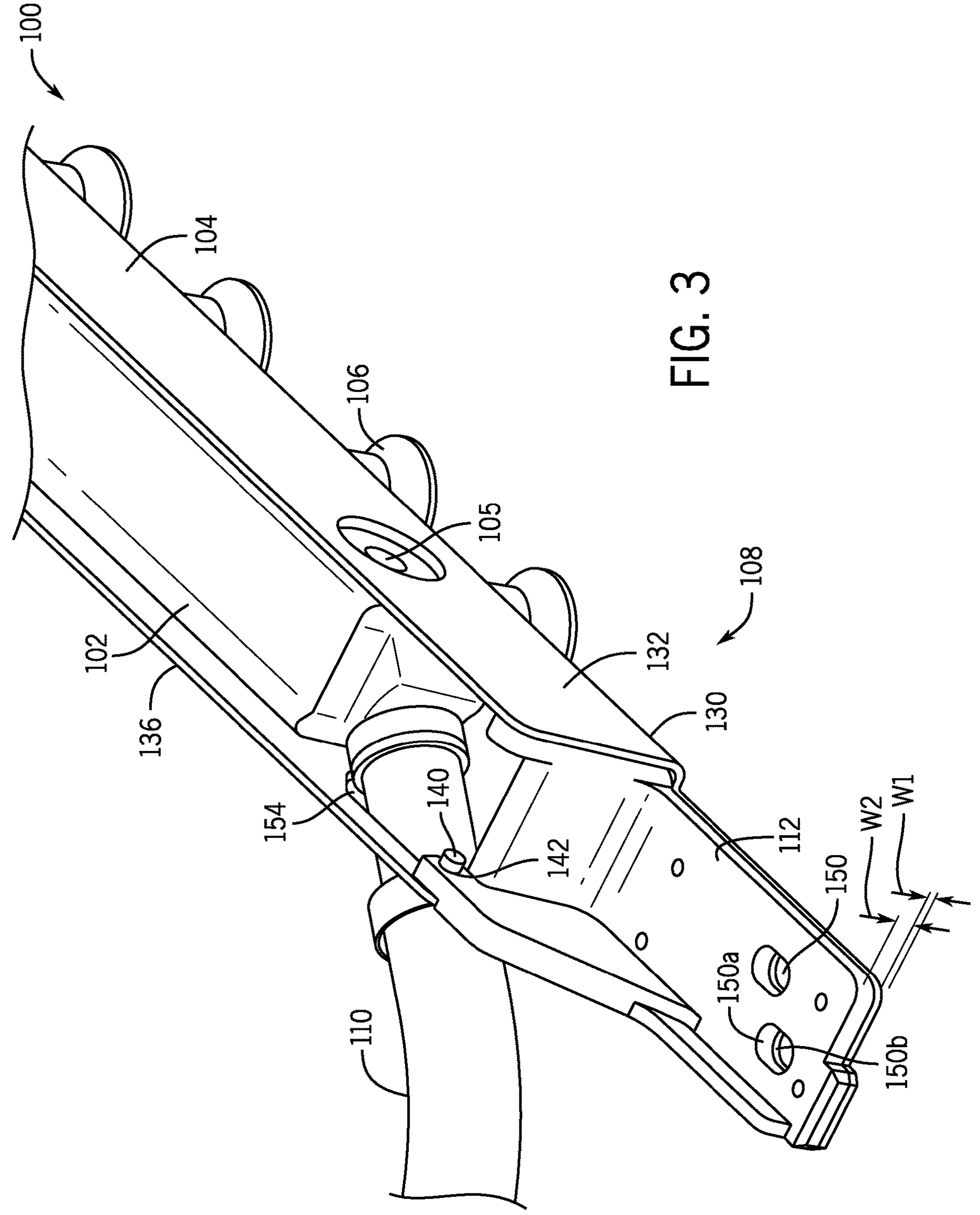
FIG. 3 is a partial bottom rear left isometric view of the manifold assembly of FIG. 1.

FIG. 3 illustrates a partial view of the bottom portion 108 of the manifold assembly 100. As illustrated, the stiffener 112 can be nested within the channel 104, and can engage (e.g., be seated on) the channel walls 130, 132, 136 of the channel 104. In some embodiments, mechanical retention structures can be defined in one or more of the stiffener 112 and the channel 104 to allow for a mechanical installation of the stiffener 112 within the channel (e.g., to eliminate the need for heat-based attachment methods). For example, in the illustrated embodiment, the channel include retention protrusions 140 that engage with retention apertures 142 of the stiffener 112 to secure the stiffener 112 in place relative to the channel 104. In other embodiments, the stiffener 112 can include retention protrusions that engage retention apertures of the channel to secure the stiffener 112 within the channel. In some embodiments, detents of one or both of the stiffener 112 and the channel 104 can engage corresponding retention mechanisms of the other of the stiffener 112 or the channel 104 to secure the stiffener 112 within the channel 104. In some embodiments, separate fasteners (e.g., screws, rivets, nails, etc.) can be used to secure the stiffener 112 to the channel 104. In some embodiments, any known mechanical retention mechanisms can be used to secure the stiffener 112 to the channel 104. In some cases, the retention protrusions can be integral with the channel 104. In some cases, the channel 104 can include an aperture that aligns with an aperture of the stiffener 112, and a dowel (e.g., a rivet) can be inserted through both of the apertures in the stiffener and the channel to secure the stiffener relative to the channel.

As further shown in FIG. 3, apertures of the stiffener 112 can be aligned with—e.g., and partly provide—the attachment points 150 of the manifold assembly 100. For example, as shown the stiffener 112 can include attachment apertures **150*a* that align with attachment apertures 150*b* of the channel 104. The manifold assembly 10 can be secured to the rack (not shown) through these respective attachment apertures 150*a*, 150*b*. The engagement between a fastener and the attachment apertures 150*a*, 150*b* can secure the stiffener 112 to the channel 104 in addition or as an alternative to the retention mechanisms described above. As also noted above, the manifold assembly 100 can be especially prone to deformation at attachment points 150 of the manifold assembly 100. Thus, providing the stiffener 112 at the attachment points 150 can reduce a deformation of the manifold assembly while additionally reducing a cumulative weight of the manifold assembly 100. As shown, the stiffener 112 or the channel 104 can also define an opening 154 for receiving hosing 110 for providing fluid to the manifold tube 102. In some cases, an opening for receiving hosing can be provided at one side, including as shown in FIG. 3**. In some cases, openings for hosing can be defined on two opposing lateral sides of a manifold assembly (e.g., opposing sides of a channel of a manifold assembly) to advantageously allow hosing to enter from either lateral direction, or to provide a greater flexibility in installation of the manifold (e.g., to allow a manifold assembly to be installed in a top-feed or bottom-feed configuration).

Figure 4:
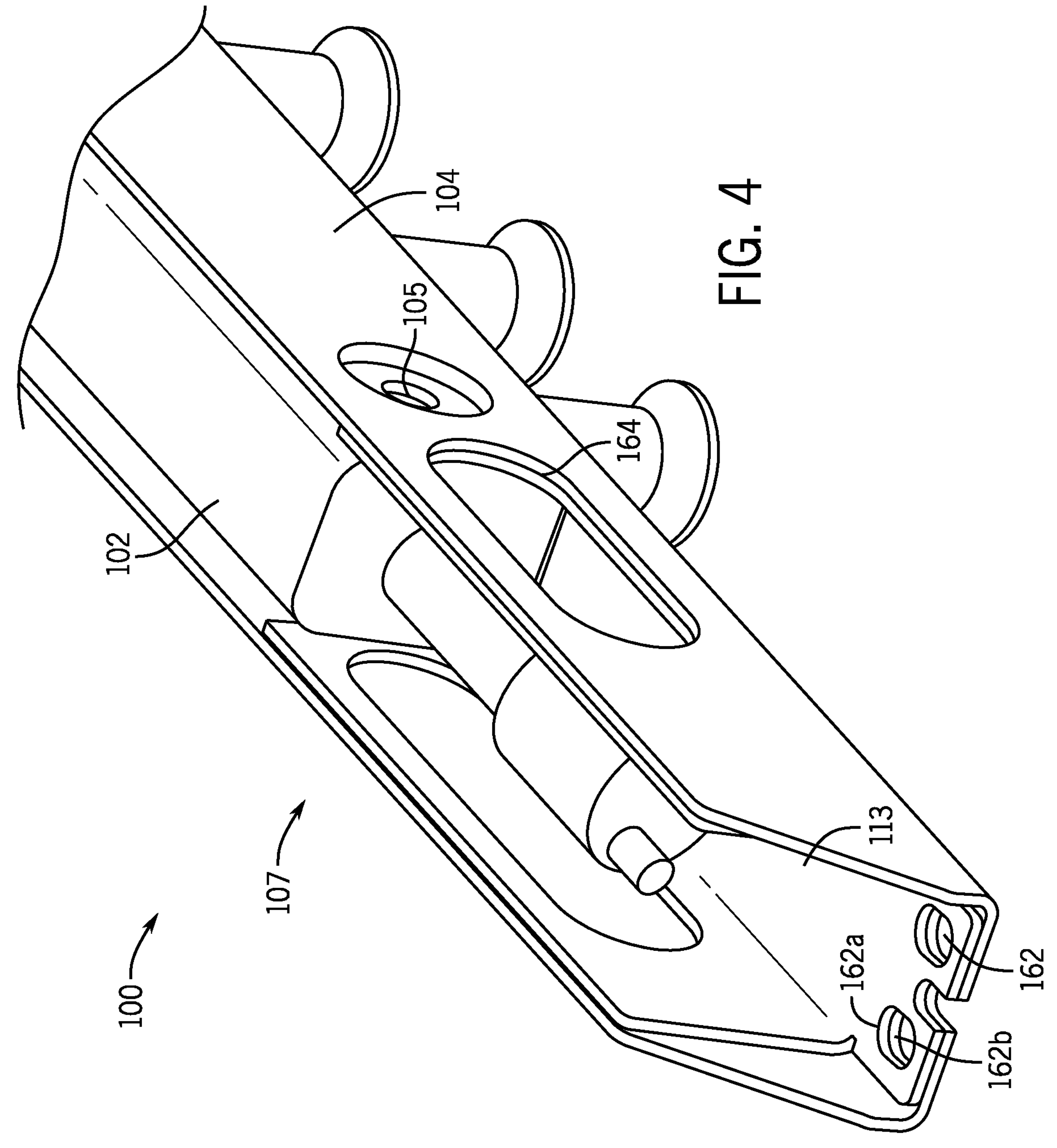
FIG. 4 is a partial top rear right isometric view of the manifold assembly of FIG. 1.

Other stiffeners can be provided in some examples, including at different locations of the manifold assembly 100. For example, FIG. 4 illustrates a partial view of the top portion 107 of the manifold assembly 100. As illustrated, a stiffener 113 can be provided along the top portion 107 and can be nested within the channel 104 to reinforce a structure thereof. As shown, the stiffener 113 can thereby increase a thickness of the manifold assembly 100 at attachment points 162 (e.g., attachment apertures, as shown). Further attachment apertures **162*a* of the stiffener 113 can be aligned with attachment apertures 162*b* of the channel 104 to collectively define the attachment points 162. As similarly discussed above, the increased thickness of the manifold assembly 100 at the attachment points 162 (e.g., due to the engagement of the stiffener 113 and the channel 104) can reduce or prevent a deformation of the manifold assembly 100 at the attachment points 162. Generally, the stiffener 113 can be secured to the channel by any mechanical retention mechanisms, including those described with respect to stiffener 112. Further, the channel 104 and stiffener 113 can collectively define an opening 164 for receiving hosing (e.g., similar to hosing 110**) in a top feed configuration (or otherwise).

Similar to the stiffener 112, the stiffener 113 can engage (e.g., be seated on) each channel wall 130, 132, 136 and can extend along a length of the channel 104 to increase a stiffness of the manifold assembly 100 along the upper portion 107. In some embodiments, however, a stiffener can be configured to extend along only one wall of a manifold, or along only two walls of a manifold. Further, the stiffener 113 can in some examples support the manifold tube 102 relative to the channel 104. For example, as similarly discussed relative to the stiffener 112, a recessed collar feature at a corresponding end of the manifold tube 102 (see, e.g., FIG. 4) can be nested onto the stiffener 113.

It should be noted that the channel 104 and the stiffeners 112, 113 will be isolated from any coolant flowing through the manifold assembly 100 and the rest of the cooling system. Therefore, it is contemplated that the material used for the channel 104 or the stiffeners 112, 113 can be different than the material used for the manifold tube 102. For example, a material for the channel 104 or the stiffeners 112, 113 can be formed from a material that is lighter, more thermally conductive, less expensive, higher strength, etc. if desired. In some embodiments, a manifold assembly can include additional stiffeners, which can be installed along a channel at any desired point to reduce a risk of deflection at the desire point without necessitating increasing a thickness of either a manifold tube or the channel along the whole length of the manifold assembly.

The manifold assembly 100 also allows for greater flexibility as it relates to the characteristics of any particular cooling system. For example, a manifold tube (e.g., the manifold tube 102) can be provided with standardized port hole sizes and locations and a channel (e.g., the channel 104) can also be provided with standardized channel aperture sizes and locations configured to align with the port holes of the manifold tube 102. Modifications to the characteristics of the system can be achieved by using different couplings (e.g., different variations of quick-connect fittings) along the fluid ports 106.

As noted above, features of a manifold assembly can provide one or more planes (e.g., a datum plane) for defining a spatial relationship between the channel 104 and the manifold tube 102. For example, a channel and a manifold tube can include a "spacer" therebetween (e.g., a stopping face). Further, a channel and a manifold tube can be secured (e.g., welded) at a surface defining an interface (e.g., a datum plane), and can thus define spatial relationships between other portions of the manifold tube and the channel (e.g., the position of weld apertures 105 of the channel 104 relative to the manifold tube 102).

Figure 5:
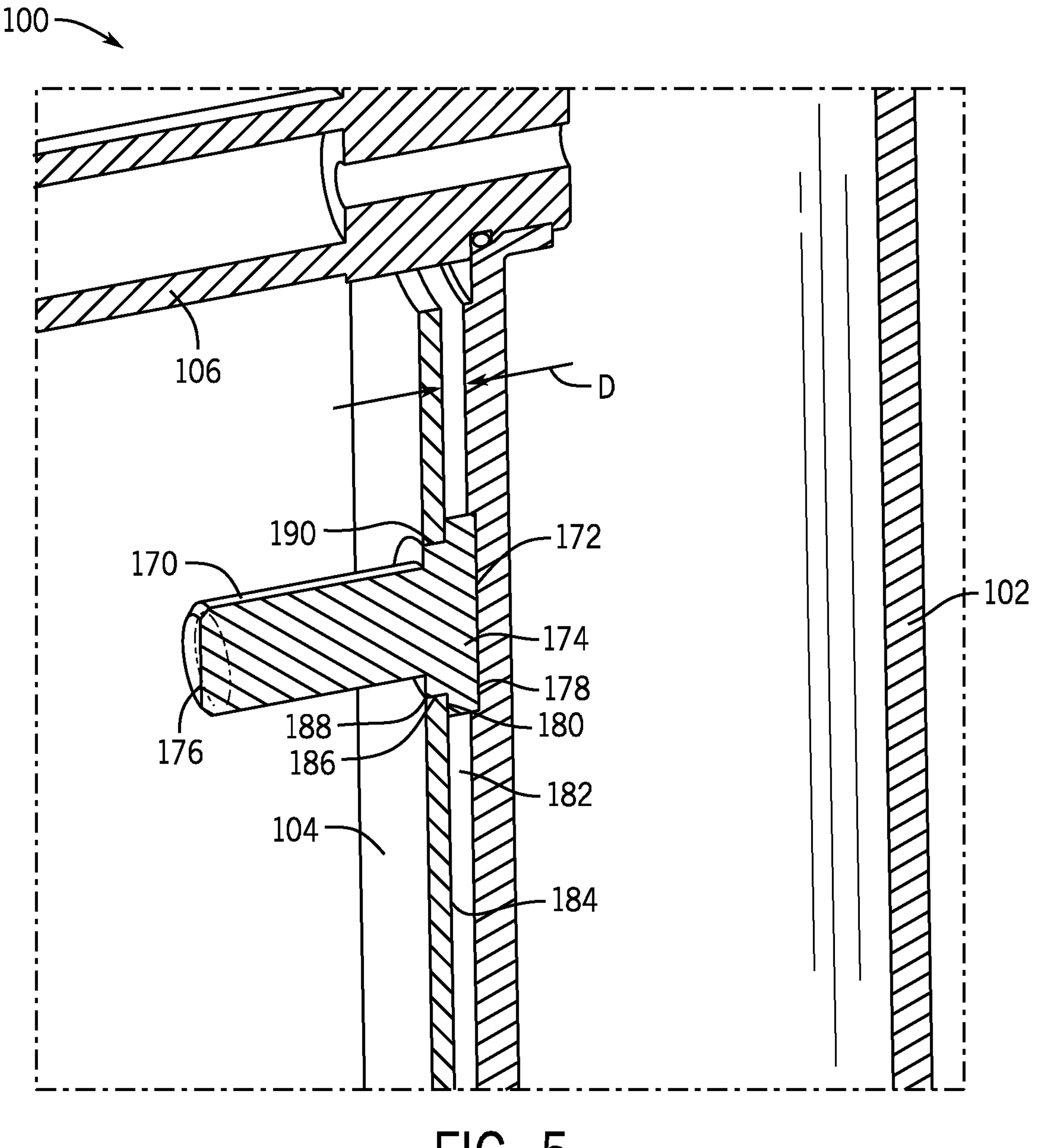
FIG. 5 is a sectional partial view of the manifold assembly of FIG. 1.

In some examples, particular locating features can be provided. In this regard, FIG. 5 illustrates the stud 170, which, as shown, defines a first portion 172 having a first diameter, a second portion 174 having a second diameter, and a threaded portion 176. The first diameter of the first portion 172 can be larger than the second diameter of the second portion 174. The first portion 172 can be received into a counterbore 178 defined on the manifold tube, and can be secured therein (e.g., welded).

The first portion 172 of the stud 170 can have a thickness in a direction perpendicular to the direction of the first diameter. An annular face 180 of the stud 170 can be parallel with a front face 182 of the manifold tube 102. The annular face 180, as shown, can be raised relative to the front face 182, and a distance D can be defined between the annular face 180 and the front face 182. When the manifold tube 102 is installed within the channel 104, an inner face 184 of the channel can contact the annular face 180, and the annular face 180 can thus define a clearance between the channel 104 and the manifold tube 102, so that a distance between the inner face 184 of the manifold tube 102 and the front face 182 of the manifold tube 102 is at least equal to the distance D. In some cases, deflection of the manifold tube 102 along portions of the tube spaced apart from the stud 170 can be greater relative to the stud than at other locations. Therefore, a distance between the front face 182 and the inner face 184 can vary with a distance away from the stud 170. In some cases, the annular surface 180, which can also be referred to as a "shoulder," is a datum plane for the manifold assembly, and the inner surface 184 of the channel 104 can be welded to the annular surface 180 to secure the channel 104 to the manifold tube 102, and define a spatial relationship between the channel 104 and the manifold tube 102 (e.g., the relationship between the channel 104 and the stud 170 can position the channel 104 relative to the manifold tube 102 to align welding apertures 105 in a desired position relative to the manifold tube 102.

In some cases, a manifold assembly can include additional geometries to define a spatial relationship between a channel and a manifold tube. For example, features can be provided on either or both of the channel and the manifold tube to prevent a displacement of the tube relative to the channel in either or both of a lateral and a vertical direction. Referring again to FIG. 5, the second portion 174 of the stud 170 can extend out from the manifold tube 102 in a direction perpendicular to the front face 182. The second portion 174 can define a radial surface 186 at least partially extending along a thickness of the second portion (e.g., the radial surface 186 can include a width in a direction perpendicular to the annular face 180). Further, the radial surface can extend along a circumference of the stud 170 at the second portion 174, and the surface can be substantially perpendicular (e.g., fully perpendicular) to any or all of the annular face 180, the front face 182, and the inner face 184. The channel 104 can include a stud aperture 188 defined by a radial wall 190, and the stud aperture can be sized to receive the second portion 174 of the stud 170. An engagement of the radial wall 190 and the radial surface 186 of the stud 170 can limit a displacement of the channel 104 relative to the manifold tube 102 in a direction parallel to any or all of the annular face 180, the front face 182 or the inner surface 184 (e.g., in a lateral or vertical direction).

In some embodiments, the channel 104 can be welded to the radial surface (e.g., the radial wall 190 can be welded to the radial surface 186) to define a datum plane for the engagement of the channel 104 and the manifold tube 102. In some cases, then, the annular surface 180 defines a stopping face and the channel 104 is not welded to the annular surface 180. In some embodiments, the channel can be welded to both of the radial surface 186 and the annular surface 180. Further, a stud aperture of a channel can be otherwise dimensioned. For example, a stud aperture can define a slot, which can allow linear movement of a stud (e.g., and therefore a manifold tube) in one direction (e.g., either vertically or laterally) while limiting displacement in other directions.

Figure 7:
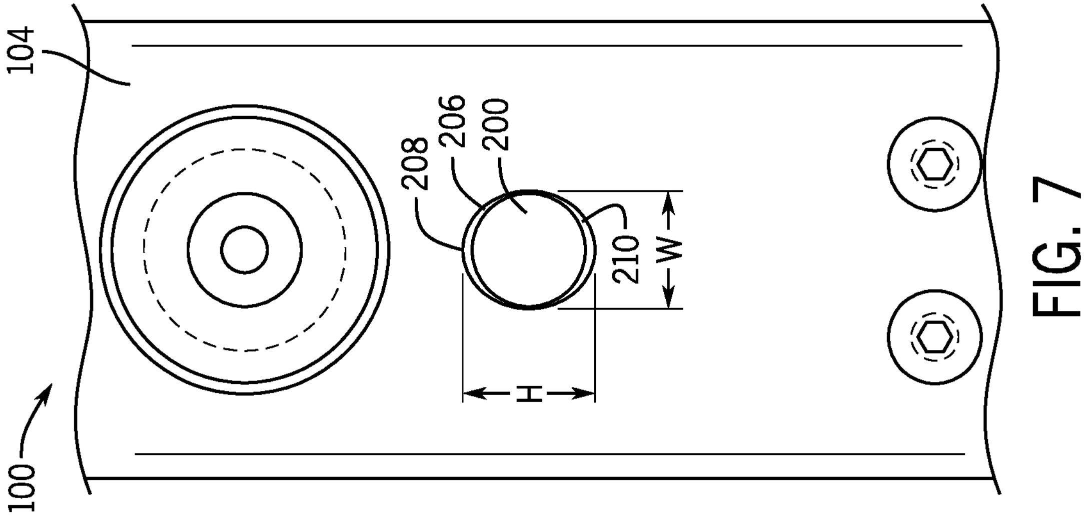
FIG. 7 is a partial front elevation view of the manifold assembly of FIG. 6.
Figure 6:
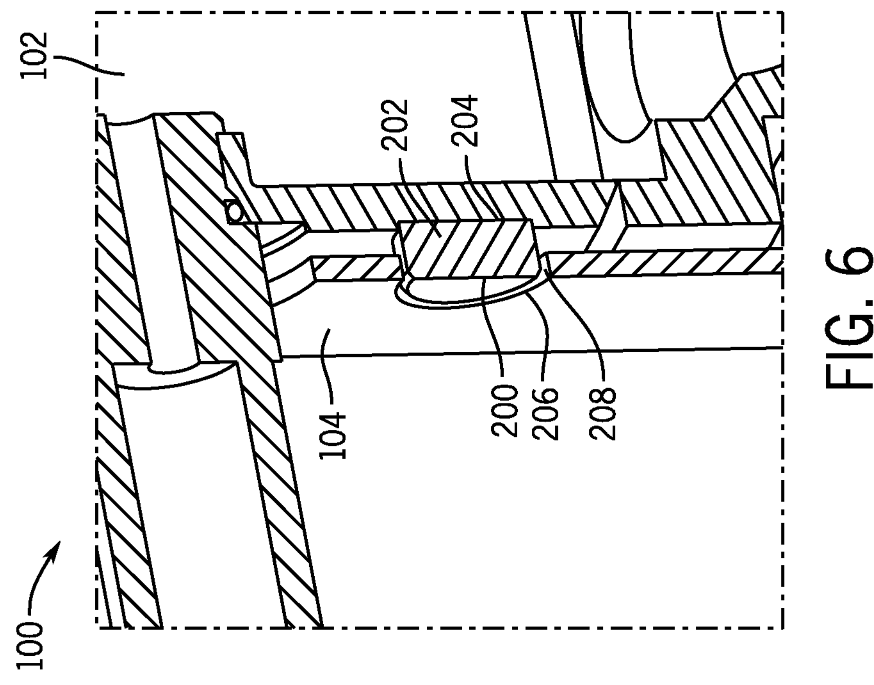
FIG. 6 is a sectional partial view of a manifold assembly, according to some embodiments.

In some embodiments, additional (or alternative) locating features can be provided for locating components of a manifold relative to each other (e.g., a channel and a manifold tube). For example, FIGS. 6 and 7 illustrate the manifold assembly 100 including a locating dowel 200. As shown, the locating dowel 200 is positioned at the bottom portion 108 of the manifold assembly 100. In some embodiments, manifold dowels can be provided at other locations, including at a top portion of a manifold assembly (e.g., top portion 107), in a central portion of a manifold assembly, or at any point along a length of the manifold assembly. In some embodiments, a manifold assembly can have two locating dowels, or three locating dowels, or four locating dowels, or more than four locating dowels. Further, it can be advantageous to provide locating dowels at locations spaced apart from a datum plane (e.g., a welded interface) of a manifold assembly, as a deformation of a manifold tube relative to a channel can tend to increase with a distance from an attachment interface (e.g., a datum plane).

As shown, the locating dowel can include a cylinder 202 defining a lateral width W. In the illustrated embodiments, the cylinder 202 is circular, and the width W corresponds to a diameter of the cylinder 202. In other embodiments, a locating dowel can define other profiles, including, for example, a rectangular profile, an oval, a square, or any other profile defining a width.

As shown, the locating dowel 200 can be fixed to the manifold tube. In the illustrated embodiment, the locating dowel 200 is received into a counterbore 204 defined on the manifold tube 102 and is welded therein. In other embodiments, a locating dowel can be provided with other configurations. For example, a locating dowel can have threaded features that engage threaded features of a manifold tube to retain the locating dowel relative to the manifold tube. In some embodiments, a locating dowel can be integrally formed with a manifold tube.

The locating dowel 200 can extend from the manifold tube 102 in a direction perpendicular to the front face 182 of the manifold tube 102. Further, a locating aperture 206 can be defined in the channel 104 and can be positioned along the channel 104 to at least partially receive the locating dowel 200 when the manifold tube 102 is fixed to the channel 104. As shown, the locating aperture 206 can have a width in a lateral direction that is approximately equal to the width W, so that, when the locating dowel 200 is received within the locating aperture 206, a lateral displacement of the channel 104 relative to the manifold tube 102 is restricted (e.g., lateral sides of the locating aperture 206 are in contact with lateral sides of the locating dowel 200). In some embodiments, a locating aperture can be circular. In some embodiments, a profile of a locating aperture can correspond with a profile of a locating dowel so that, when the locating dowel is received within the locating aperture, a contact between walls of the aperture and a surface of the locating dowel prevents both lateral and vertical displacement of the locating dowel (e.g., and thus the manifold tube) relative to a channel.

In some embodiments, a locating aperture can be shaped to accommodate a displacement of locating dowel received therein in one or more directions. For example, in the illustrated embodiment, the locating aperture 206 defines a slot, having a height H (e.g., a dimension in the vertical direction) that is greater than the width W. As shown, therefore, one or more gaps 210 can be defined between the dowel 200 and a wall 208 of the locating aperture 206. Thus, displacement of the locating dowel 200 can be constrained in a lateral direction (e.g., in a direction of the width W), but displacement can be allowed in a vertical direction along the one or more gaps 210. In other embodiments, locating features (e.g., a locating dowel of a manifold tube and a corresponding locating aperture of a channel) can constrain movement of the tube and the channel in a vertical direction. In some embodiments locating features can be otherwise arranged to constrain relative movement of components of a manifold assembly. For example, a dowel can be fixed (e.g., welded) to a channel, and can be received within a corresponding feature (e.g., a counterbore) of a manifold tube to locate the channel relative to the manifold tube.

Figures 8, 9:
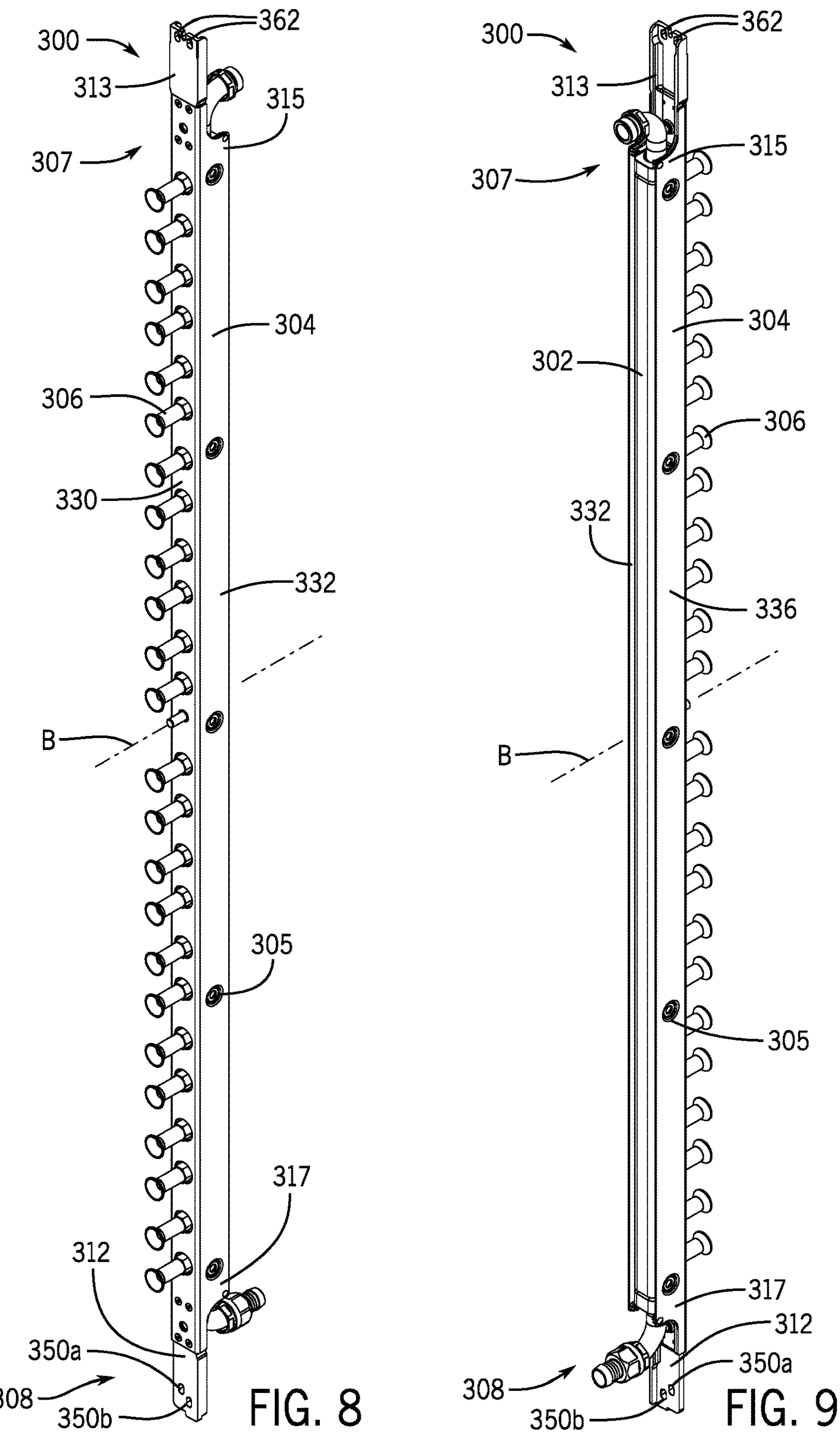
FIG. 8 is a front isometric view of view of a manifold assembly according to an embodiment.
FIG. 9 is a rear isometric view of the manifold assembly of FIG. 8.

In some examples, a rack manifold assembly can include other configurations for advantageously enhancing a stiffness of the manifold assembly and providing attachment points for the manifold assembly to secure the manifold assembly to a rack. For example, FIGS. 8 and 9 illustrate an example manifold assembly 300. The manifold assembly can be similar to manifold assembly 100 illustrated in FIGS. 1-7 and can include similar numbering for similar components. For example, the rack manifold assembly 300 can include a channel 304, a manifold tube 302, a bottom stiffener 312 at a bottom portion 308 of the manifold assembly 300, and a top stiffener 313 at a top portion 307 of the manifold assembly 300. The channel 304 can be similar to the channel 104 described in FIGS. 1 and 2, and can include a first channel wall 330, a second channel wall 332 and a third channel wall 336. The second and third channel walls 332, 336 can extend from the first channel wall 330 at opposite lateral sides of the first channel wall 330, in a direction parallel to axis B). In the illustrated embodiment, as described below, the top stiffener 313 and the bottom stiffener 312 include different features and define different geometries (e.g., as described with respect to FIGS. 10-13). In other embodiments, a top stiffener and a bottom stiffener can be substantially identical, as can advantageously allow the manifold assembly to be installed in any desired orientation (e.g., with no difference in a top or bottom of the rack manifold). In the illustrated example, the channel 304 is symmetrical about a central axis B, with a top distal portion 315 being substantially identical to a bottom distal portion 317. In some cases, providing a channel with identical distal portions can simplify a manufacturing process for a channel, and allow similar tooling and processes for forming features at a top of the channel as at a bottom of the channel.

Stiffeners for a manifold assembly can provide features for securing the manifold assembly to a rack and can be configured to accommodate features of a rack. In some cases, racks can include different configurations for mounting rack manifolds to the rack. For example, in some cases, mounting apertures of a rack (e.g., mounting apertures corresponding to apertures at attachment points of a manifold assembly) can be differently positioned in different locations (e.g., in different data centers), between different rack types (e.g., between racks from different suppliers, or racks configured for different computing loads and applications), or between installations for particular entities (e.g., different companies can define different standards for mounting locations and configurations of a manifold assembly to the rack). In some cases, stiffeners can be adapted for particular mounting configurations without requiring customization of a channel and a manifold tube to accommodate differing mounting configurations. For example, as illustrated in FIGS. 8 and 9, the attachment points 362 can be defined in the top stiffener 313 and attachment points **350*a*, 350*b* can be defined in the bottom stiffener 312. The attachment point 350*a* can be vertically offset (e.g., higher) relative to the attachment point 350*b*, as can correspond to mounting points at a rack to which the manifold assembly can be mounted. As further shown, the attachment points 362 defined in the top stiffener 313 can be vertically aligned (e.g., the attachment points can be at a same vertical height, in a direction corresponding to an elongate direction of the manifold assembly 300). In other examples, a rack can include mounting apertures at different locations, and attachment points can be defined in other locations on a stiffener for a manifold assembly (e.g., on stiffeners similar to stiffeners 312, 313**). For example, attachment points of a top stiffener can be offset from each other in a vertical direction or can be defined at different locations along the stiffener than in the illustrated embodiment. In some cases, a stiffener can include different features for mounting a manifold assembly to a rack.

In the illustrated embodiment, the attachment points **350*a*, 350*b*, 362 are defined in the stiffeners 312, 313, without a corresponding attachment point on a channel (e.g., the embodiment of FIGS. 8 and 9 does not require an alignment of apertures of stiffeners and the channel to define an attachment point). Adapting stiffeners to particular mounting configurations without requiring corresponding changes in a channel or manifold tube can advantageously reduce a cost of manufacturing for a manifold assembly and allow a manifold assembly to be usable in a wider range of applications. In some cases, a length of a stiffener for a manifold assembly can be adapted for a rack in which the manifold assembly is to be installed, without requiring a corresponding adaptation (e.g., providing a longer or shorter manifold tube and channel) to accommodate racks having different distances between mounting points at a top and bottom of the channel. For example, in the illustrated embodiment, the top stiffener 313 extends past the top distal portion 315 in the elongate direction of the manifold assembly 300 (e.g., in a direction opposite the direction of gravity) and the bottom stiffener 312 extends downwardly past the bottom distal portion 317 (e.g., in the direction of gravity). The stiffeners 312, 313** can extend to lengths corresponding to mounting apertures defined on a rack. In other embodiments, a length by which a stiffener extends past a distal portion of the channel can be adapted to a mounting configuration of the rack (e.g., stiffeners can be customized for mounting configurations without requiring a corresponding customization of a channel and manifold tube).

Figure 10:
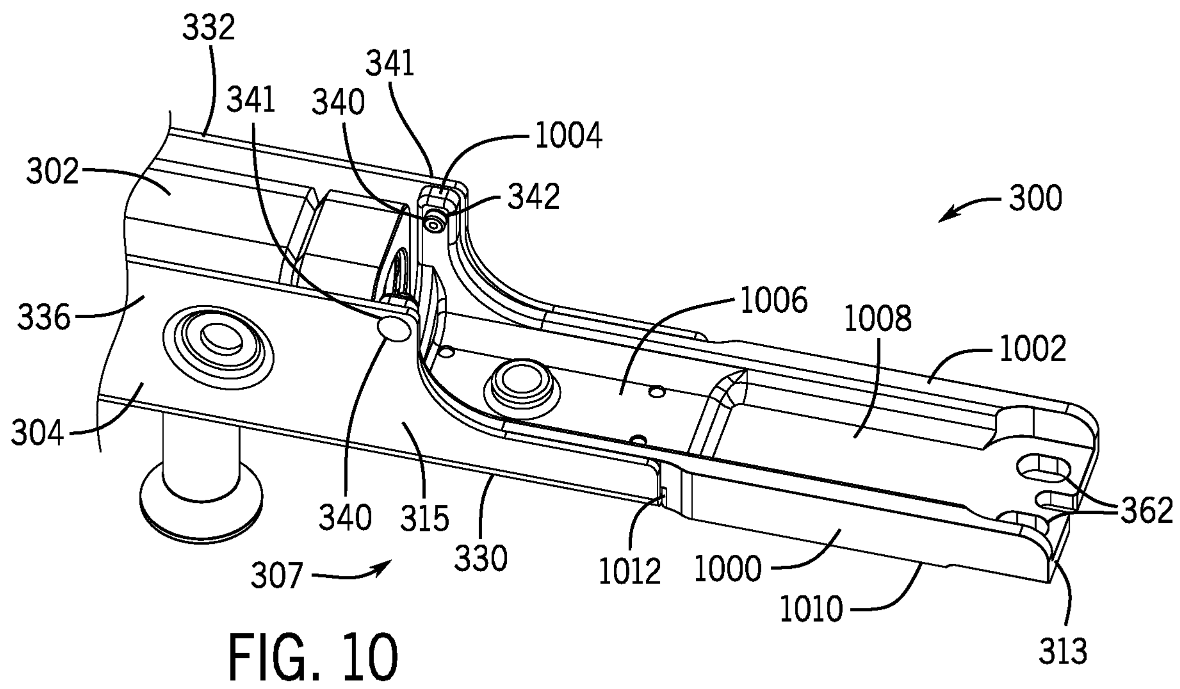
FIG. 10 is a partial top rear right isometric view of the manifold assembly of FIG. 8.
Figure 11:
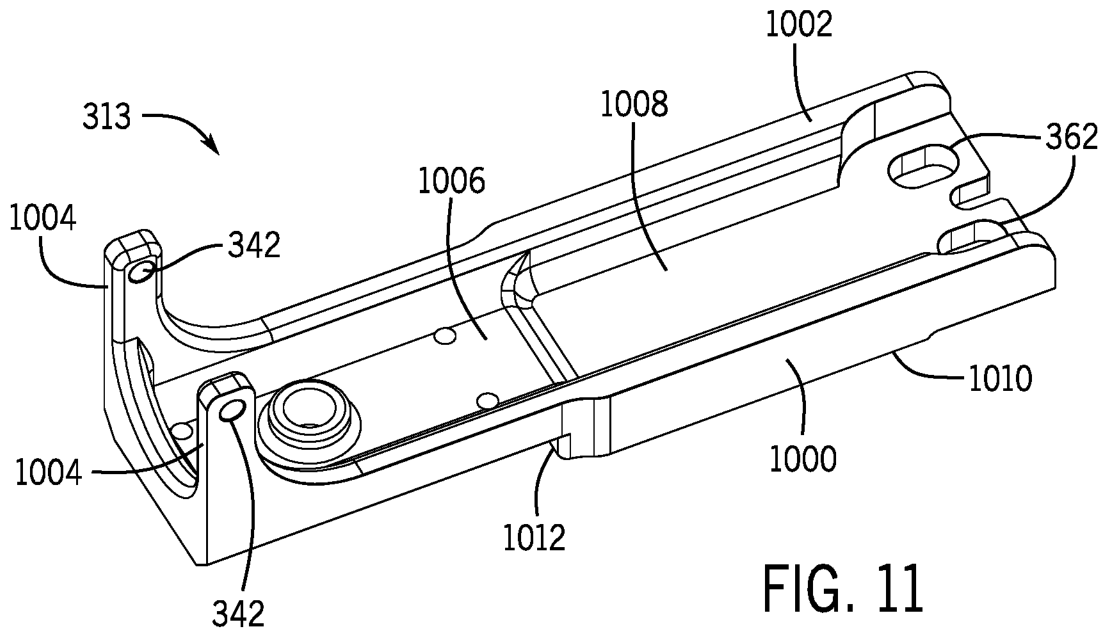
FIG. 11 is an isometric view of a top stiffener for the manifold assembly of FIG. 8, according to some embodiments.
Figure 12:
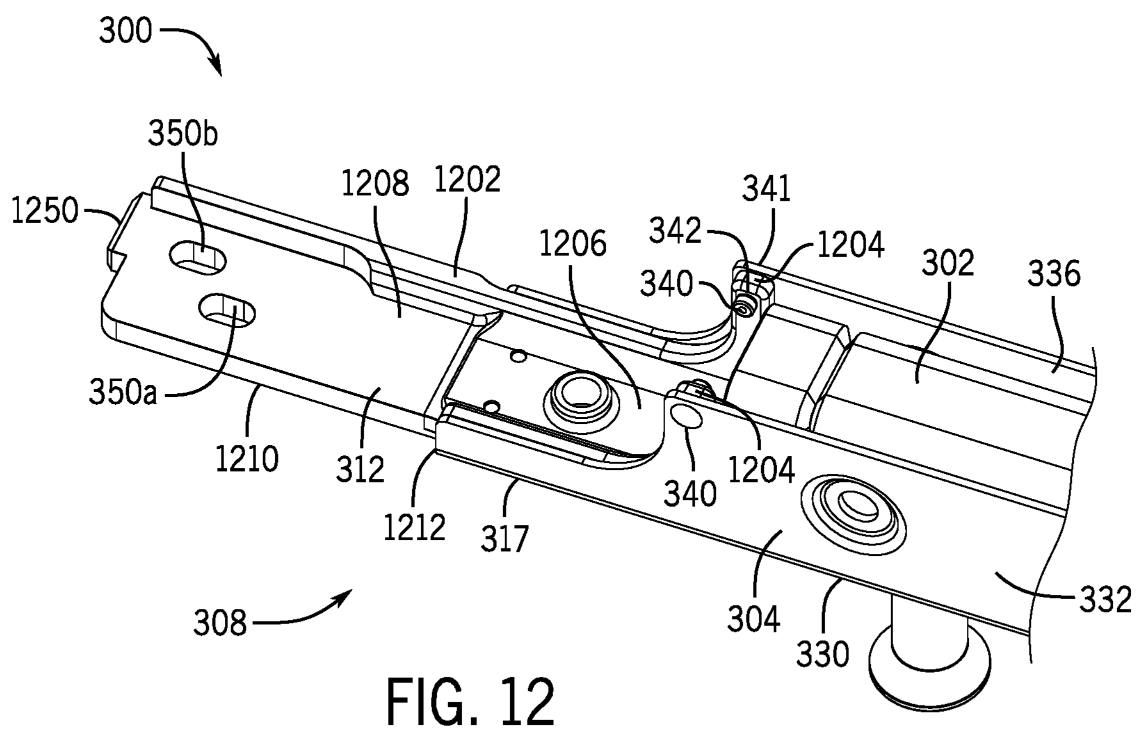
FIG. 12 is a partial bottom rear right view of the manifold assembly of FIG. 8.

Stiffeners for a manifold assembly can have features and geometries to increase a stiffness of a manifold assembly, and distribute a load from attachment points (e.g., a load from a weight of a manifold assembly, a load opposing a fluid pressure at ports of the assembly, a load from spring forces at liquid ports of the manifold assembly, etc.). For example, as shown in FIG. 10, the stiffener 313 can include longitudinal ribs 1000, 1002 (e.g., flanges) that extend from the stiffener (e.g., in a direction parallel to axis B shown in FIGS. 8 and 9), and increase a thickness of the stiffener along the length of the respective ribs. In the illustrated example, the ribs 1000, 1002 extend longitudinally (e.g., across an elongate direction of the stiffener 313) at opposite lateral sides of the stiffener 313. The flanges can increase a thickness of the stiffeners 313 along portions of the stiffener 313 and can oppose deformation forces on the stiffener (e.g., compressive and tensile forces). In the illustrated embodiment, the ribs 1000, 1002 extend along opposing lateral sides of the stiffener 313. In other examples, a stiffener can include one flange (e.g., as shown in FIGS. 11 and 12 with respect to stiffener 312). In some cases, a stiffener can include more than two ribs to increase a stiffness of the stiffener. A stiffener can further include ribs that extend in a width direction (e.g., laterally) to oppose torsion forces on the stiffener. In some cases, a stiffener does not include flanges.

As further shown in FIG. 10, the stiffener 313 can include extending leg members 1004 that extend outwardly from the stiffener 313 in a direction substantially perpendicular (e.g., perpendicular) to an elongate direction of the stiffener 313 (e.g., the leg members 1004 can extend in a direction parallel to the axis B shown in FIGS. 8 and 9 when the stiffener 313 is installed in the channel 304). As shown, an aperture 342 can be provided in a distal end of the leg member 1004 and the stiffener 313 can be secured to the channel 304 at the aperture 342 (e.g., with a rivet 340 extending through the aperture 342 and a corresponding aperture 341 of the channel 304). The leg members 1004 can be secured to the channel 304 at respective sidewalls 332, 336 of the channel 304, which can advantageously distribute a load and diminish deformation forces on portions of the channel 304. The length of the leg members 1004 can correspond to a reduction in force exerted on the channel at the attachment interface (e.g., at rivet 340) between the stiffener 313 and the channel 304. For example, a moment can be produced on the stiffener 313 at the attachment points 362 when the manifold assembly is installed on a rack, and the moment can be countered by corresponding moments produced at the leg members 1004 (e.g., at the apertures 342 when the stiffener 313 is secured to the channel 304). A greater length of the leg members 1004 can reduce a force required at the attachment interface between rivet 340 and aperture 342 to counter a moment on the stiffener 313, and can thereby reduce (e.g., eliminate) a potential deformation of the channel 304 at an attachment interface between the stiffener 313 and the channel 304. In some examples, multiple leg members can be provided on a lateral side of a stiffener, as can advantageously distribute a load to multiple locations along a channel. In some cases, a leg member can include multiple apertures to secure the stiffener to the channel. In some cases, a stiffener can include a sidewall (e.g., additionally or alternatively to an extending leg member) that extends parallel to a sidewall of a channel, and apertures can be defined along the sidewall to define attachment locations for the channel and the stiffener.

Stiffeners can include geometries to interact with channels of a manifold assembly to advantageously allow the stiffener to be received within the channel. For example, as shown, the stiffener includes a first longitudinal portion 1006 and a second longitudinal portion 1008, the first portion sized and configured to be received within the channel 304, and the second longitudinal portion 1008 configured to extend from the channel 304 and engage a rack. For example, a lateral width of the first longitudinal portion 1006 can be less than a lateral width of the channel (e.g., a distance between the second wall 332 and the third wall 336) as can allow the first longitudinal portion 1006 to be received within the cannel. A width of the second longitudinal portion 1008 can be greater than a width of the first longitudinal portion 1006, as shown. In some cases, including as illustrated, the width of the second longitudinal portion 1008 exceeds a distance between the second wall 332 and the third wall 336, and the width can serve as a locating feature. For example, the stiffener 313 can be inserted into the channel 304, and the width of the second portion can serve as a stop (e.g., the width can prevent further insertion of the stiffener 313 into the channel 304). In some cases, a surface 1010 of the second longitudinal portion 1008 can extend outwardly from the stiffener 313 (e.g., in a direction parallel to axis B shown in FIGS. 8 and 9). The surface 1010 can be substantially parallel (e.g., flush) with a front face of the first wall 330 when the stiffener is installed in the channel 304. In some cases, a shelf 1012 can be defined between the first longitudinal portion 1006 and the second longitudinal portion 1008. The shelf 1012 can engage a distal edge of the first wall of the channel 304 and can provide a locating feature of the stiffener 313 relative to the channel 304 to assist in an alignment of components of the channel 304 and the stiffener 313. For example, when an edge of the channel 304 is in contact with the shelf 1012, the aperture 342 can be aligned with the corresponding aperture 341 defined in the channel for the insertion of a fastener (e.g., the rivet 340) therethrough to secure the stiffener 313 to the channel 304.

Figure 13:
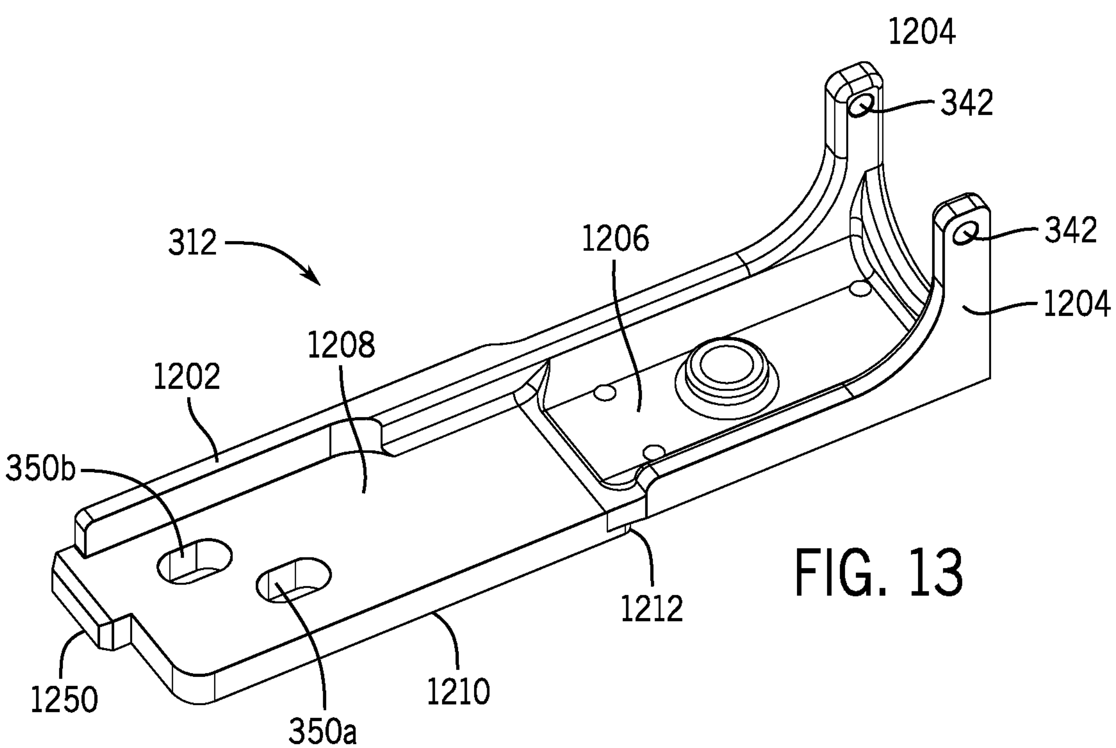
FIG. 13 is an isometric view of a bottom stiffener for the manifold assembly of FIG. 8, according to some embodiments.

In some cases, as mentioned above, stiffeners at a top and bottom of a manifold assembly can be substantially identical, as can advantageously produce manufacturing efficiencies in production of the stiffeners and reduce a cost of manufacturing. In some cases, geometries of stiffeners can allow for stiffeners to be produced by casting, which can further reduce a cost of manufacturing over subtractive manufacturing technique that may otherwise be required for complex geometries. In some cases, one or more of the top and bottom stiffeners can include features to interact with corresponding features of a rack. In the illustrated example of FIGS. 8 and 9, the stiffener 313 and the stiffener 312 include similar features, but are differently configured (e.g., to accommodate different mounting configurations of a rack at a top attachment interface and a bottom attachment interface). As shown in FIGS. 12 and 13, the bottom stiffener 312 can be similar to the top stiffener and include similar numbering for similar features. For example, the bottom stiffener 312 can include extending legs 1204 with apertures 342 to receive a rivet 340 (e.g., a fastener extending through an aperture 341 in the channel 304 and the aperture 342 to secure the stiffener 312 to the channel 304). The stiffener 312 can further include a first portion 1206 sized to be received into the channel 304 (e.g., with a width in a lateral direction that is less than a width defined between channel walls 332 and 336), and a second portion 1208 that extends outwardly past a distal end 317 of the channel 304 (e.g., downwardly parallel to a direction of gravity when the manifold assembly is installed on a rack). The second portion 1208 can define a width in the lateral direction that is greater than a distance between channel walls 332, 336, as can advantageously provide a locating feature to align and position the stiffener 312 relative to the channel 304 when the stiffener 312 is installed in the channel 304. A shelf 1212 can be defined between the first portion 1206 and the second portion 1208, and the shelf can receive a distal edge of the first channel wall 330 to further provide a locating feature for the stiffener 312 relative to the channel 304.

In some examples, the bottom stiffener can include different features and configurations than a top stiffener (e.g., to accommodate different mounting configurations, access requirements, installation procedures, etc.). For example, as discussed above, the locations of the attachment apertures 350*a*, 350*b* along the bottom stiffener can differ from a location of attachment apertures provided on a top stiffener (e.g., the attachment apertures 362 of the top stiffener 313 shown in FIGS. 10 and 11), as can correspond to locations of attachment apertures positioned on a mounting interface for a rack. In some cases, a bottom stiffener can be designed to provide access to elements of a rack positioned in a bottom portion of the rack (e.g., proximate to the bottom stiffener when the bottom stiffener is installed). For example, as shown the bottom stiffener includes a rib 1202 positioned along a first lateral side of the stiffener, and a second lateral side of the stiffener can be devoid of a corresponding rib. In the illustrated example, the absence of a rib on one lateral side of the stiffener 312 can provide space for access to features of the rack (e.g., can allow tooled adjustment of levelling feet of a rack). In some examples, locations of ribs of a stiffener can be different. For example, one or more ribs can extend longitudinally along a central portion of a stiffener (e.g., between lateral edges) alternatively or in addition to ribs being provided along lateral sides of a stiffener. As further illustrated, the bottom stiffener includes a protruding portion 1250 extending from a distal end of the stiffener (e.g., an end of the stiffener opposite the end of the stiffener that is proximate the manifold tube 302). The protruding portion 1250 can be sized and configured to be received (e.g., matingly received) into a corresponding feature of a rack. When received into a corresponding feature of a rack, the protruding portion 1250 can advantageously provide a locating feature to ensure a desired positioning of the manifold assembly 300 relative to the rack (e.g., with attachment apertures 350*a*, 350*b*, 362 align with corresponding apertures or protrusions on a rack). In some examples, a bottom stiffener can include other features to engage with corresponding features of a rack to position the manifold assembly relative to the rack (e.g., protrusions, latch mechanisms, ramped surfaces, indents, etc.).

Figure 14:
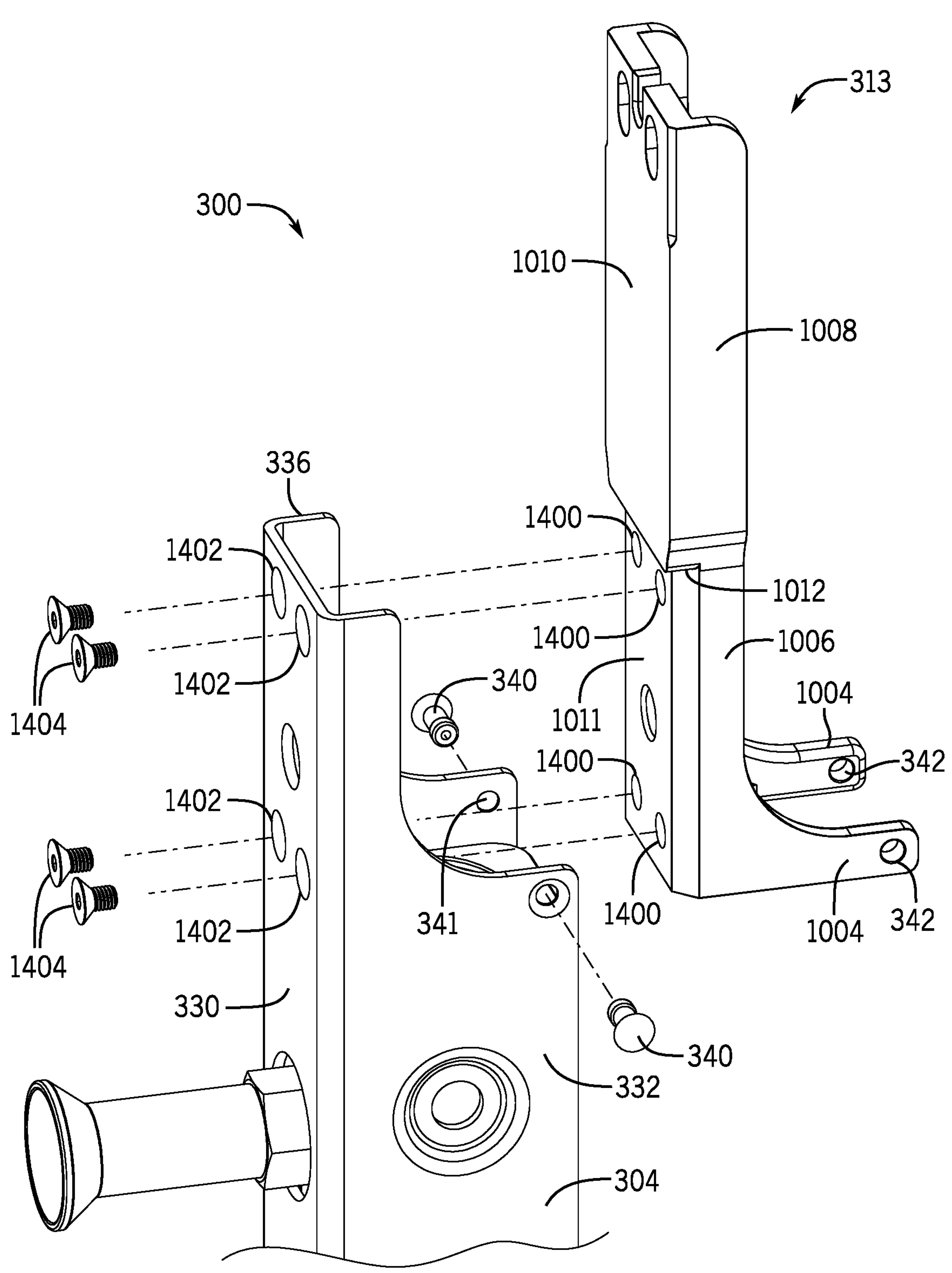
FIG. 14 is an exploded view of an attachment interface of a stiffener and a channel of the manifold assembly of FIG. 8.

Stiffeners for rack manifold assemblies can include further features for locating the stiffener relative to a channel and securing the stiffener to the channel. For example, it can be advantageous to provide a plurality of attachment interfaces for a stiffener relative to the channel, as this can distribute a load across the attachment interfaces, reducing a probability of deformation at a given interface. For example, as shown in FIG. 14, the first longitudinal portion 1006 of the stiffener 313 (e.g., the portion to be received by the channel 304) can include an outward facing surface 1011, which can face the first channel wall 330 when the stiffener 313 is received in the channel 304. The surface 1011 can be parallel to the surface 1010 and can be offset from the surface 1010 in a depth direction (e.g., a direction parallel to ais B, illustrated in FIGS. 8 and 9. An offset distance between the surfaces 1010, 1011 can correspond to a thickness of the first wall 330 of the channel 104. In some cases, the offset distance can be substantially similar to a thickness of the first wall 330 (e.g., the surface 1010 can be flush with an outer facing surface of the first wall 330 when the stiffener 313 is installed in the channel 304).

As illustrated, a plurality of locating apertures 1400 can be provided on the surface 1100 and can extend through the first longitudinal portion 1006. As illustrated, the channel 304 can include a plurality of apertures 1402 defined in the first wall, and the apertures 1402 can be positioned to align with corresponding locating apertures 1400 of the stiffener 313 when the stiffener 313 is installed in the channel 304. In some cases, as shown, protruding cylinders 1404 can be provided to extend through the apertures 1402 and corresponding locating apertures 1400 to at least partially retain the stiffener 313 relative to the channel 304. In some cases, the protruding cylinders 1404 can be threaded screws, and a threaded engagement between the threaded screws and the locating apertures 1400 can secure the stiffener 313 relative to the channel 304 (e.g., the locating apertures 1400 can be threaded to receive a threaded portion of a threaded screw). In some cases, the protruding cylinders 1404 can provide a locating feature to define a desired position of the stiffener 313 relative to the channel 304. In some cases, the protruding cylinders 1404 are not threaded. In other embodiments, protrusions for positioning a stiffener relative to a channel can be integral with the channel. In some cases, apertures can be defined in a channel (e.g., apertures 1402) to correspond to protrusions of a stiffeners, and a mating engagement between protrusions of a stiffener and apertures of a channel can at least partially retain the stiffener relative to the channel and define a spatial relationship between the stiffener and the channel. In some cases, locating features can be provided along lateral sides (e.g., features of channel walls 332, 336 can interact with corresponding features on lateral sides of the stiffener 313) to provide a locating function and retain the stiffener in the channel. In the illustrated embodiment, there are four locating apertures 1400 defined on the stiffener 313, and a corresponding four apertures 1402 defined in the channel 304. In other embodiments, a number of locating apertures and corresponding apertures of a channel can be fewer or more than four. Additionally, locating apertures can be arranged in various patterns on a stiffener 313, including in a rectangular pattern (e.g., as shown) in a linear pattern, in a triangular pattern (e.g., with three apertures arranged at respective corners of the triangular pattern) or any other pattern suited for retention of a stiffener relative to a channel. In the illustrated embodiment, the stiffener 313 and the channel 304 are mechanically coupled (e.g., with cylinders 1404 and rivets 340). In other embodiments, a stiffener can be welded to a channel, or can be otherwise retained in a channel.

In some implementations, devices or systems disclosed herein can be utilized or installed using methods embodying aspects of the invention. Correspondingly, description herein of particular features or capabilities of a device or system is generally intended to inherently include disclosure of a method of using such features for intended purposes and of implementing such capabilities. Similarly, express discussion of any method of using a particular device or system, unless otherwise indicated or limited, is intended to inherently include disclosure, as embodiments of the invention, of the utilized features and implemented capabilities of such device or system. For example, aspects of the disclosed technology can include the manufacture or installation of the various manifold assemblies discussed above, as well as operation of a cooling system that includes such assemblies.

Thus, embodiments of the disclosed systems can provide improved manifold assemblies that reduce a deformation of elements of the assembly due to lateral forces, and therefore provide and maintain a unified datum plane between attachment points at a top and bottom of the manifold assembly so that fluid ports therefore can remain in alignment. Further, embodiments of the disclosed invention can reduce a need for a use of thick-walled manifold pipes, and thereby reduce a heat and deformation during fabrication of fluid ports. Thus, a total weight of a manifold assembly can be reduced, increasing a safety of installation of the manifold assembly to a rack.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A manifold assembly for a server rack, the manifold assembly comprising:

a manifold tube including at least one side wall;

a channel having a top portion and a bottom portion, wherein each of the top portion and the bottom portion includes at least one attachment aperture, the channel being rigidly secured to the manifold tube to provide structural support thereto relative to the server rack;

a first stiffener including at least one aperture, the first stiffener at least partially received within the channel at the top portion, and the at least one attachment aperture of the top portion being aligned with the at least one aperture of the first stiffener, a distal portion of the first stiffener extending outwardly from the bottom portion of the channel in an elongate direction of the manifold assembly, the distal portion including an aperture configured to align with a corresponding aperture of a server rack when the manifold assembly is mounted on the server rack; and a second stiffener including at least one aperture, the second stiffener being at least partially received within the channel at the bottom portion, and the at least one attachment aperture of the bottom portion being aligned with the at least one aperture of the second stiffener.

2. The manifold assembly of claim 1, wherein the channel includes a first side wall, a second side wall, and a third side wall, the second and third side walls extending along opposing lateral sides of the first side wall and the at least one attachment aperture being defined in the second side wall.

3. The manifold assembly of claim 1, wherein the manifold tube is a square tube, and the at least one side wall includes four side walls.

4. The manifold assembly of claim 1, wherein a thickness of the at least one side wall of the manifold tube is less than or equal to 0.25 inches.

5. The manifold assembly of claim 1, wherein the first stiffener is seated along an internal surface of the channel at the at least one attachment aperture to stiffen to the manifold assembly at the top portion.

6. The manifold assembly of claim 5, wherein the first stiffener is mechanically attached to the channel.

7. The manifold assembly of claim 1 wherein the first stiffener includes a longitudinal rib extending along an elongate direction of the stiffener.

8. The manifold assembly of claim 1, wherein the channel defines a plurality of weld apertures, and the manifold tube is secured to the channel by plug welds at the plurality of weld apertures.

9. The manifold assembly of claim 8, wherein the plurality of weld apertures includes a first plurality of weld apertures in a first wall of the channel and a second plurality of weld apertures in a second wall of the channel opposite the first wall.

10. A manifold assembly for a server rack, the manifold assembly comprising:

a manifold tube extending along an elongate portion of the manifold assembly;

a channel including a first distal portion including a first aperture;

a first stiffener, including a first longitudinal portion and a second longitudinal portion, the first longitudinal portion including a second aperture and the second longitudinal portion including a third aperture, the first longitudinal portion being received in the distal portion of the channel, and the second longitudinal portion extending outwardly from the channel in an elongate direction of the manifold assembly, the second aperture being axially aligned with the first aperture, and the third aperture being configured to align with a corresponding retention feature of a server rack.

11. The manifold assembly of claim 10, wherein the first stiffener includes a longitudinal rib extending along a lateral side of the first stiffener.

12. The manifold assembly of claim 11, wherein the channel includes a central wall having a plurality of apertures and the first stiffener includes a surface facing the central wall, the surface including a plurality of locating apertures, wherein each of the plurality of apertures of the channel wall is aligned with a corresponding locating aperture.

13. The manifold assembly of claim 12, further comprising a second stiffener at least partially received within the channel at a second distal portion of the manifold assembly.

14. The manifold assembly of claim 10, wherein the first stiffener includes a leg member that extends from the first stiffener in a direction perpendicular to the elongate direction, wherein the second aperture is defined in the leg member.

15. The manifold assembly of claim 10, wherein the manifold assembly is secured to the server rack at the third aperture.

16. The manifold assembly of claim 10, further including a locating stud, configured to matingly engage with a counterbore defined in the manifold tube;

wherein the channel includes a locating aperture that defines a first width, and wherein, the locating stud is secured within the counterbore and at least partially extends through the locating aperture.

17. The manifold assembly of claim 16, wherein the locating stud includes a mounting face opposing the manifold tube, and the channel include an inner face facing the manifold tube; and wherein the mounting face contacts the inner face.

18. The manifold assembly of claim 16, wherein the locating aperture defines a first height that is greater than the first width.

* * * * *